(12) United States Patent
Duncan et al.

(10) Patent No.: US 12,238,887 B2
(45) Date of Patent: Feb. 25, 2025

(54) MOUNTING APPARATUS FOR COMPONENTS WITHOUT MOUNTING POINTS IN MODULAR DATA CENTERS

(71) Applicant: Dell Products L.P., Round Rock, TX (US)

(72) Inventors: Tyler Baxter Duncan, Austin, TX (US); Anthony Middleton, Cedar Park, TX (US)

(73) Assignee: DELL PRODUCTS L.P., Round Rock, TX (US)

( * ) Notice: Subject to any disclaimer, the term of this patent is extended or adjusted under 35 U.S.C. 154(b) by 240 days.

(21) Appl. No.: 17/970,310

(22) Filed: Oct. 20, 2022

(65) Prior Publication Data

US 2024/0138090 A1 Apr. 25, 2024
US 2024/0237257 A9 Jul. 11, 2024

(51) Int. Cl.
*H05K 7/14* (2006.01)
*H05K 7/20* (2006.01)

(52) U.S. Cl.
CPC ......... *H05K 7/1489* (2013.01); *H05K 7/1405* (2013.01); *H05K 7/1487* (2013.01); *H05K 7/20145* (2013.01)

(58) Field of Classification Search
CPC .. H05K 7/1497; H05K 7/1495; H05K 7/1489; H05K 7/18; H05K 5/0234; H05K 7/1488; H05K 7/183; H05K 7/20781; H05K 7/20745; H05K 7/20736; H05K 7/2079; H05K 5/02; H05K 5/0217; H05K 7/1405; H05K 7/20645; H02B 1/34
See application file for complete search history.

(56) References Cited

U.S. PATENT DOCUMENTS

| | | | |
|---|---|---|---|
| 5,210,680 | A | 5/1993 | Scheibler |
| 6,164,369 | A | 12/2000 | Stoller |
| 6,353,529 | B1 | 3/2002 | Cies |
| 6,442,030 | B1 | 8/2002 | Mammoser |
| 6,688,711 | B1 | 2/2004 | Mease |
| 7,016,191 | B2 | 3/2006 | Miyamoto |
| 7,026,551 | B2 | 4/2006 | Franz |
| 7,054,155 | B1 | 5/2006 | Mease et al. |
| 7,142,425 | B2 | 11/2006 | Tomioka |
| 7,189,924 | B1 | 3/2007 | Popescu |
| 7,385,810 | B2 | 6/2008 | Chu |
| 7,580,259 | B2 | 8/2009 | Hsiao |

(Continued)

*Primary Examiner* — Michael A Matey
(74) *Attorney, Agent, or Firm* — Aly Z. Dossa; Chamberlain, Hrdlicka, White, Williams & Aughtry

(57) ABSTRACT

A modular data center includes: a modular information technology component (MITC), in which the MITC comprises a cooling distribution unit (CDU), a floor, a bottom cooling distribution unit mounting component (CDUMC), a modular over-rack component (MORC), and a top CDUMC, in which the floor comprises a floor track apparatus (FTA), in which the bottom CDUMC affixes the CDU to the FTA, in which the top CDUMC affixes the CDU to the MORC, in which the top CDUMC provides air containment with an internal environment of the MITC; and a modular environmental control component (MECC), in which the MECC comprises a plurality of environmental control components (ECCs) and built-in airflow connection components, in which the built-in airflow connection components remove and supply air to the MITC.

17 Claims, 8 Drawing Sheets

(56) References Cited

U.S. PATENT DOCUMENTS

| | | |
|---|---|---|
| 7,660,117 B2 | 2/2010 | Werner |
| 7,679,909 B2 | 3/2010 | Spearing |
| 7,813,121 B2 | 10/2010 | Bisson |
| 7,916,471 B2 | 3/2011 | Miyamoto |
| 8,077,462 B2 | 12/2011 | Barringer |
| 8,164,897 B2 | 4/2012 | Graybill |
| 8,199,485 B2 | 6/2012 | Cheng |
| 9,042,099 B2 | 5/2015 | Campbell |
| 9,585,282 B1* | 2/2017 | Gandhi ................. H04L 41/145 |
| 10,292,313 B2* | 5/2019 | Magallanes ........ H05K 7/20754 |
| 10,802,556 B2 | 10/2020 | North |
| 2003/0026084 A1 | 2/2003 | Lauchner |
| 2004/0182798 A1 | 9/2004 | Williams |
| 2007/0045479 A1 | 3/2007 | Nguyen |
| 2008/0060790 A1* | 3/2008 | Yates ......................... F16F 7/14 |
| | | 361/679.48 |
| 2008/0064317 A1* | 3/2008 | Yates ................. H05K 7/20754 |
| | | 454/118 |
| 2011/0094978 A1* | 4/2011 | Bailey ...................... H05K 7/18 |
| | | 211/26.2 |
| 2011/0315353 A1 | 12/2011 | Campbell |
| 2012/0119632 A1* | 5/2012 | Bousseton ............. H05K 13/00 |
| | | 312/236 |
| 2012/0134104 A1* | 5/2012 | Driggers ............... H05B 47/175 |
| | | 361/679.02 |
| 2012/0155027 A1* | 6/2012 | Broome ............. H05K 7/20745 |
| | | 361/688 |
| 2013/0032310 A1* | 2/2013 | Jaena ................... H05K 7/1497 |
| | | 165/138 |
| 2013/0264026 A1 | 10/2013 | Eckberg |
| 2014/0319985 A1* | 10/2014 | Kikuchi ............. H05K 7/20736 |
| | | 312/317.1 |
| 2015/0105930 A1* | 4/2015 | Sparrowhawk ........... G05F 1/66 |
| | | 700/297 |
| 2017/0268239 A1* | 9/2017 | Kobayashi ........ E04F 15/02405 |
| 2018/0092227 A1* | 3/2018 | Stewart ................ H05K 5/0234 |
| 2018/0213673 A1* | 7/2018 | Eckberg ............... H05K 7/1488 |
| 2018/0223541 A1* | 8/2018 | Kobayashi ........... H05K 7/1497 |
| 2021/0127523 A1* | 4/2021 | Bailey .................. H05K 7/1491 |
| 2022/0007547 A1* | 1/2022 | Farshchian ........ H05K 7/20745 |
| 2023/0117815 A1* | 4/2023 | Ruiz Holguin .......... H05K 7/18 |
| | | 361/826 |
| 2024/0138085 A1* | 4/2024 | Duncan ................. H05K 7/202 |
| 2024/0138086 A1* | 4/2024 | Duncan ................. H05K 7/202 |
| 2024/0138088 A1* | 4/2024 | Duncan ................ H05K 7/1487 |
| 2024/0138089 A1* | 4/2024 | Duncan ................ H05K 9/0015 |
| 2024/0138122 A1* | 4/2024 | Duncan .............. H05K 7/20272 |

* cited by examiner

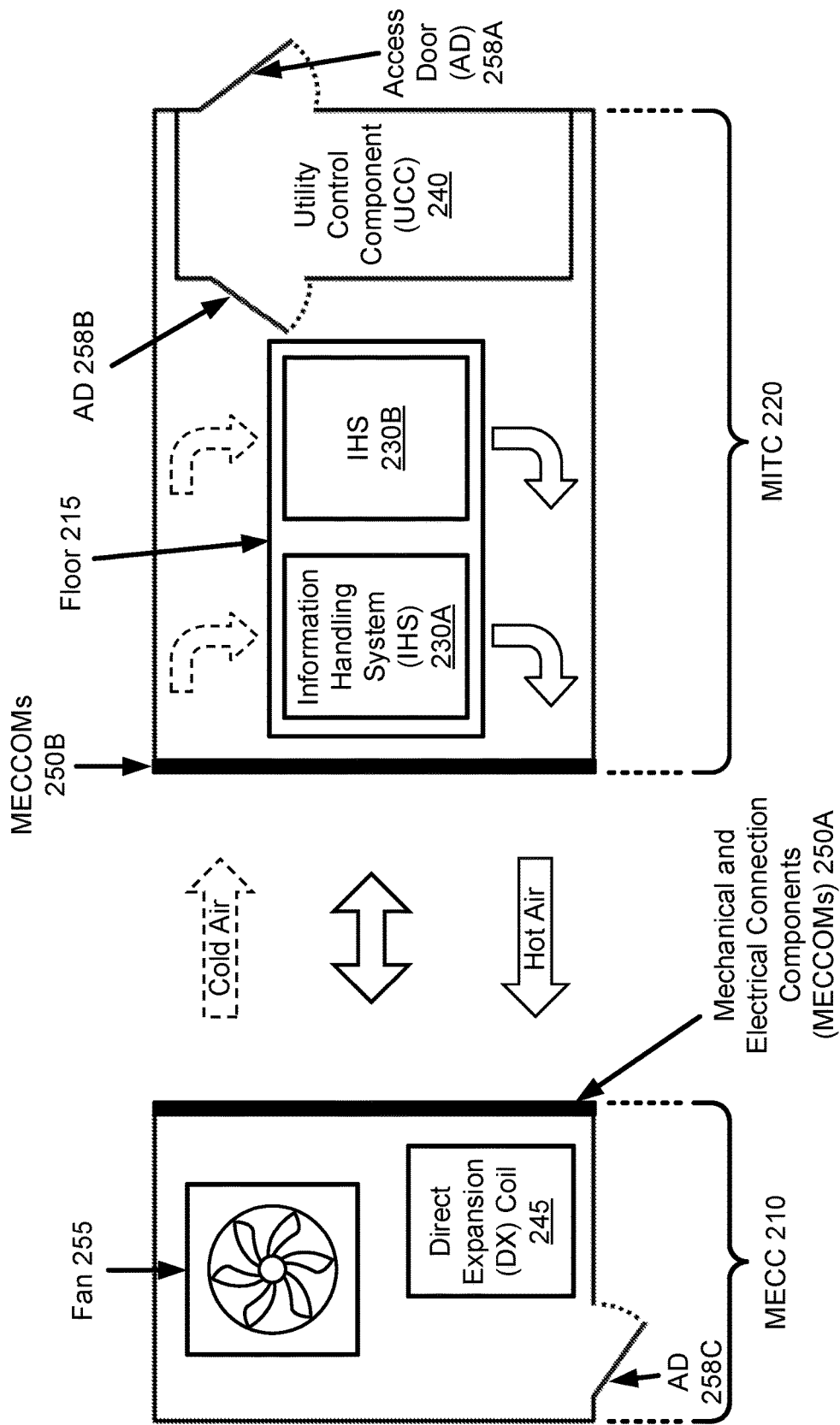
FIG. 2.1

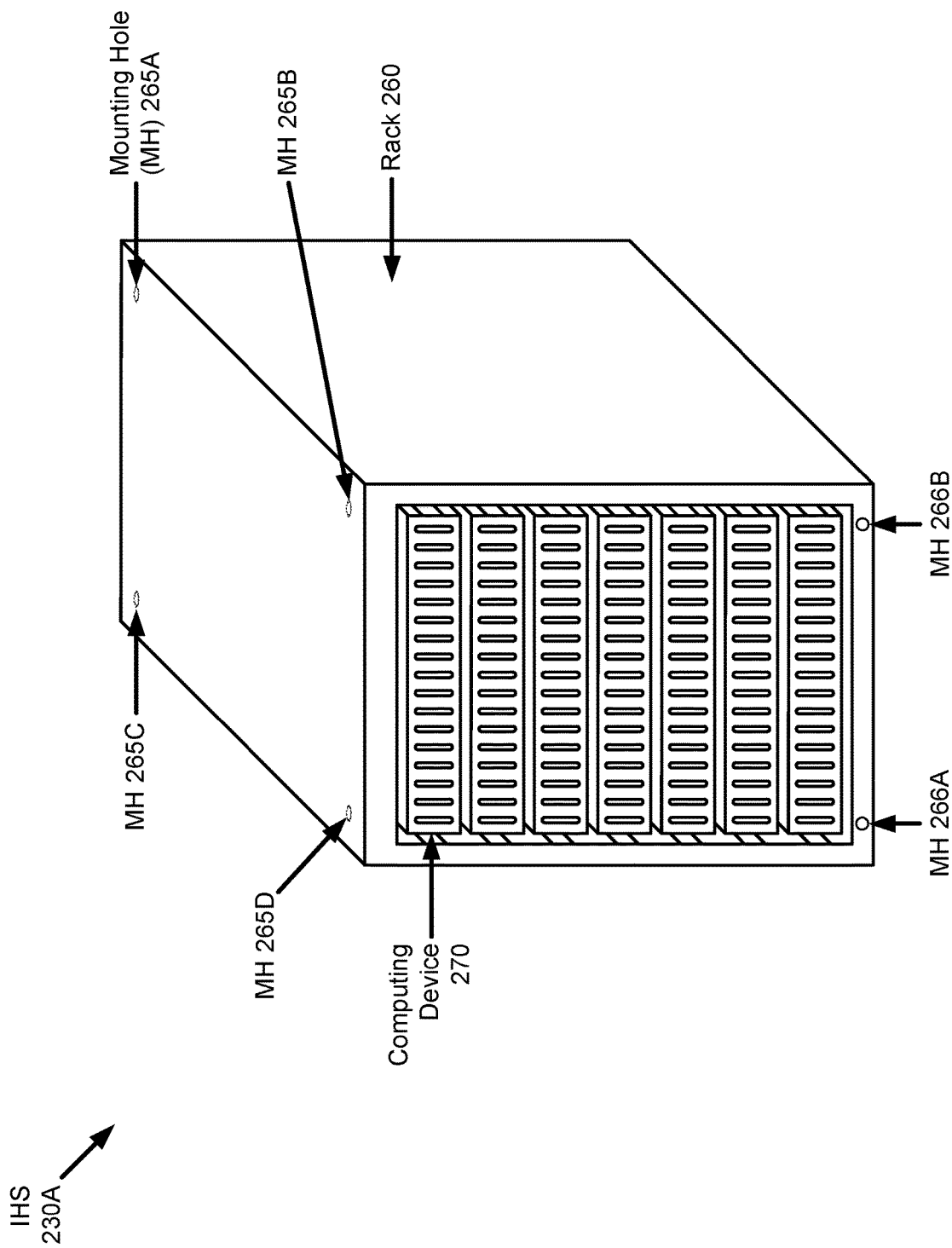
FIG. 2.2

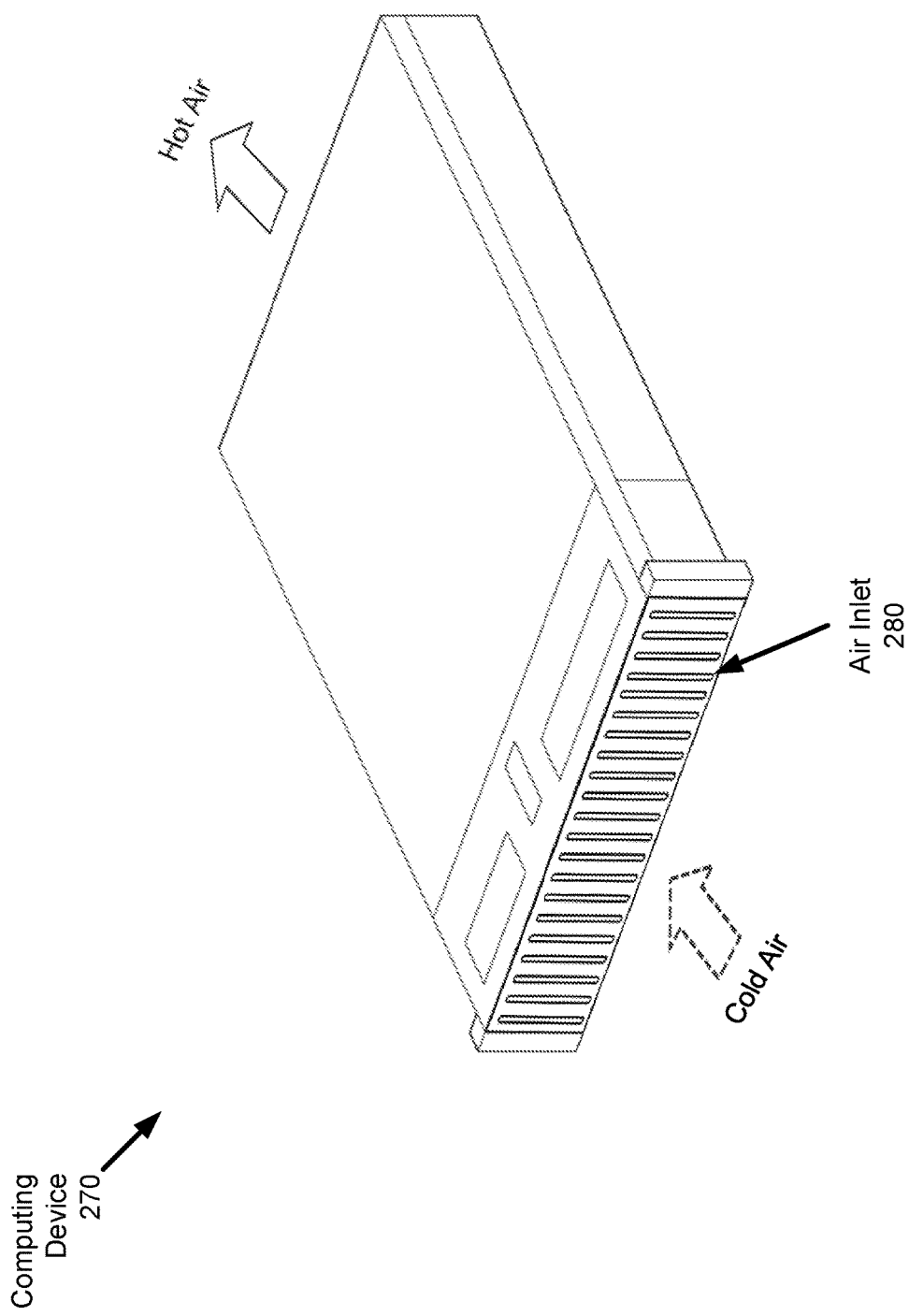
FIG. 2.3

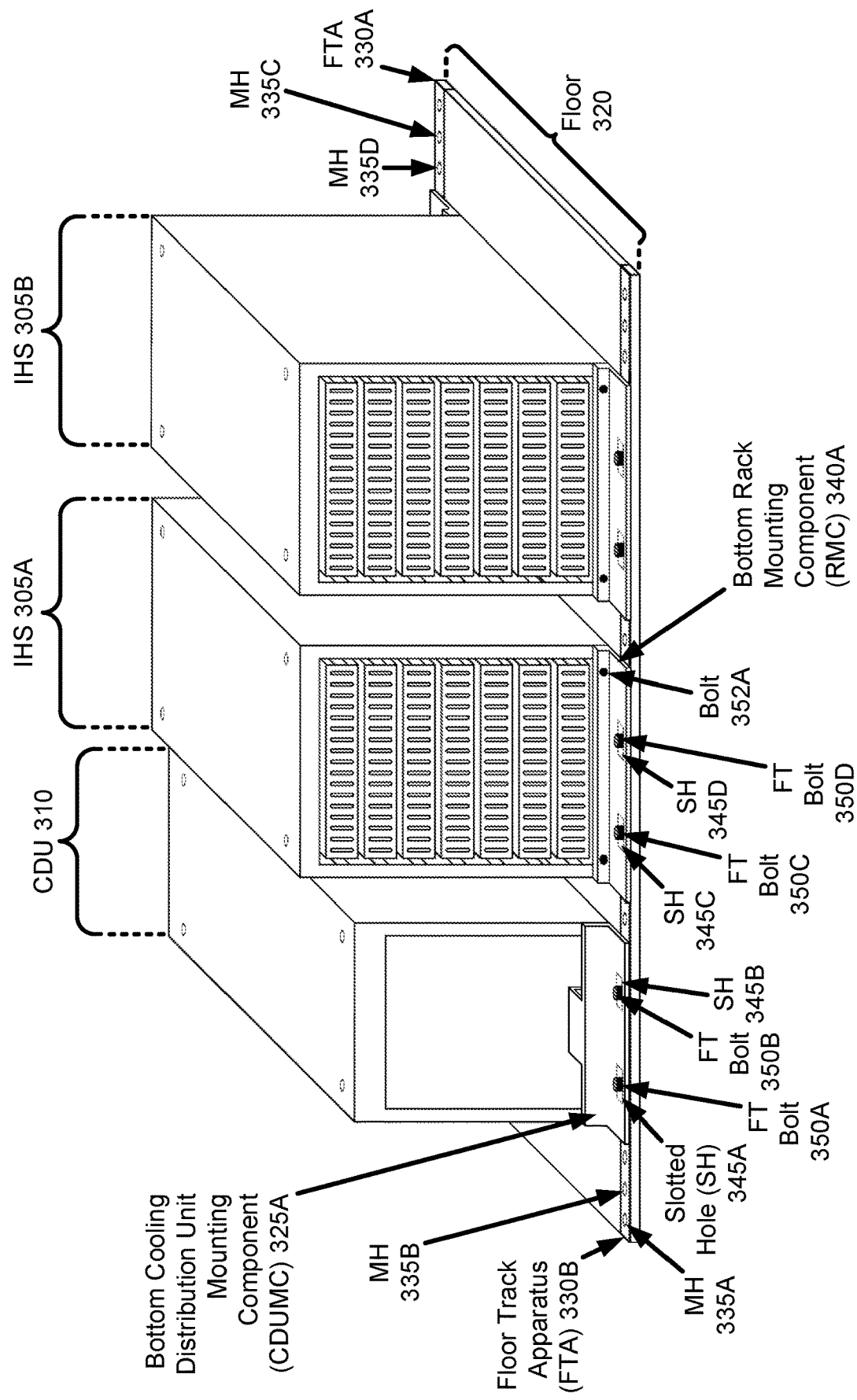
FIG. 3.1

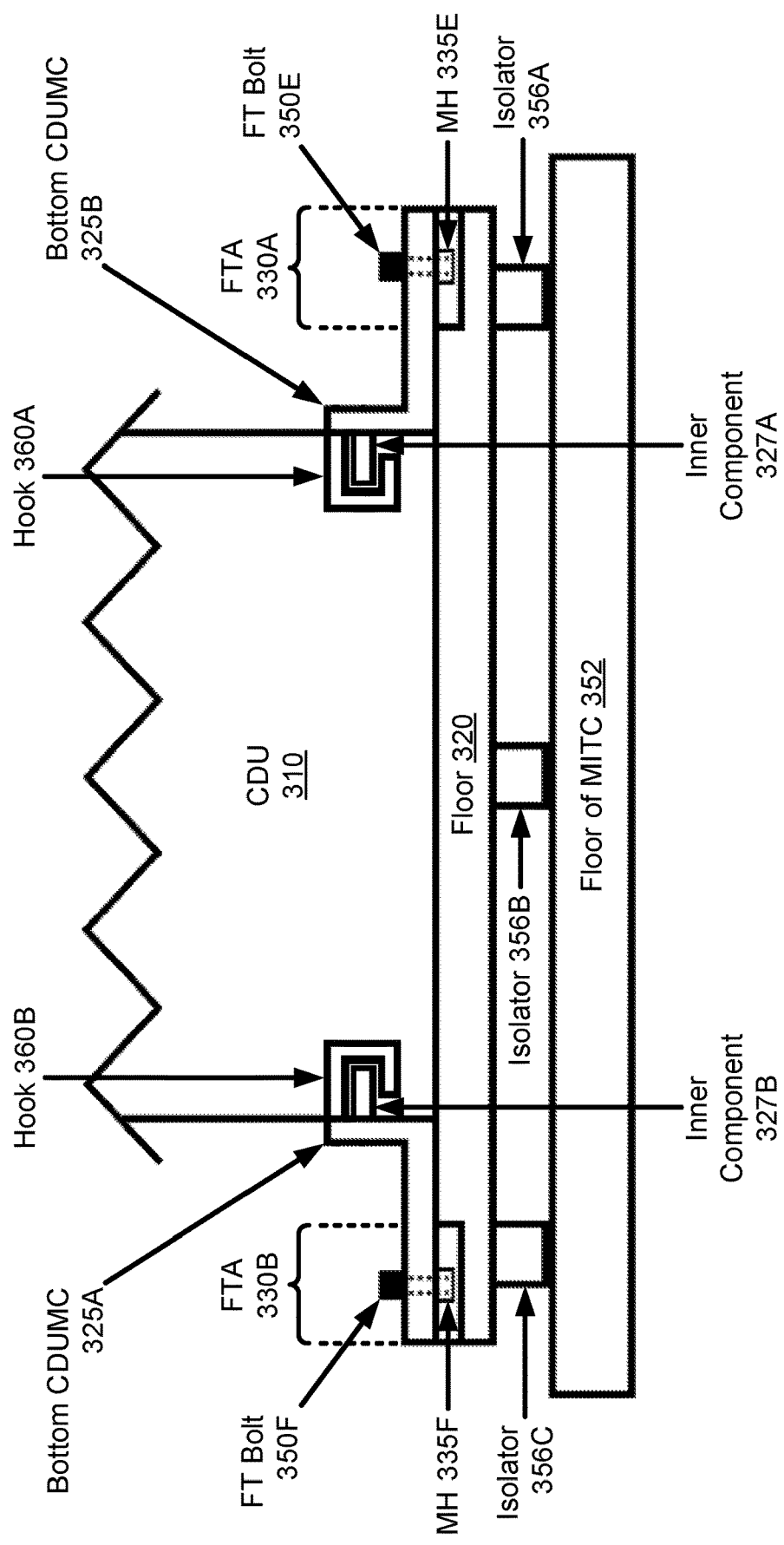
FIG. 3.2

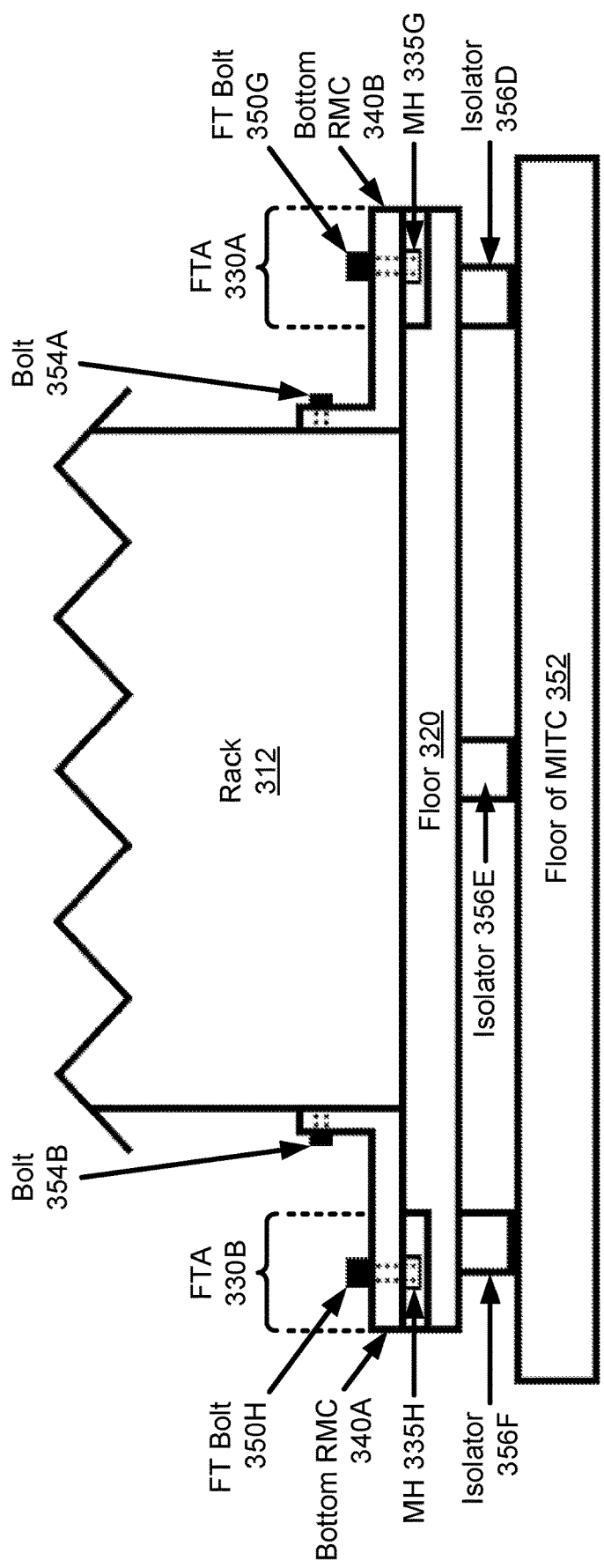
FIG. 3.3

MOUNTING APPARATUS FOR COMPONENTS WITHOUT MOUNTING POINTS IN MODULAR DATA CENTERS

BACKGROUND

The heterogeneous data center environments witnessed today often require a combination of various cooling, power, and information technology (IT) components. The cooling, power, and IT components are available either commercially with minimum configuration options (e.g., one-size-fits-all) or through a full custom solution for a specific customer demand. This either impacts scalability of the heterogeneous data center environments, or requires resource-intensive engineering for deployment of the cooling, power, and IT components.

BRIEF DESCRIPTION OF DRAWINGS

Certain embodiments of the invention will be described with reference to the accompanying drawings. However, the accompanying drawings illustrate only certain aspects or implementations of the invention by way of example, and are not meant to limit the scope of the claims.

FIG. 2.1 shows a top view of the system of FIG. 1 in accordance with one or more embodiments of the invention.

FIG. 2.2 shows a diagram of an information handling system (IHS) in accordance with one or more embodiments of the invention.

FIG. 2.3 shows a diagram of a computing device in accordance with one or more embodiments of the invention.

FIG. 3.1 shows a diagram of a portion of the system of FIG. 1 in accordance with one or more embodiments of the invention.

FIG. 3.2 shows a side view of a portion of the system of FIG. 1 in accordance with one or more embodiments of the invention.

FIG. 3.3 shows a side view of a portion of the system of FIG. 1 in accordance with one or more embodiments of the invention.

DETAILED DESCRIPTION

Figure 1:
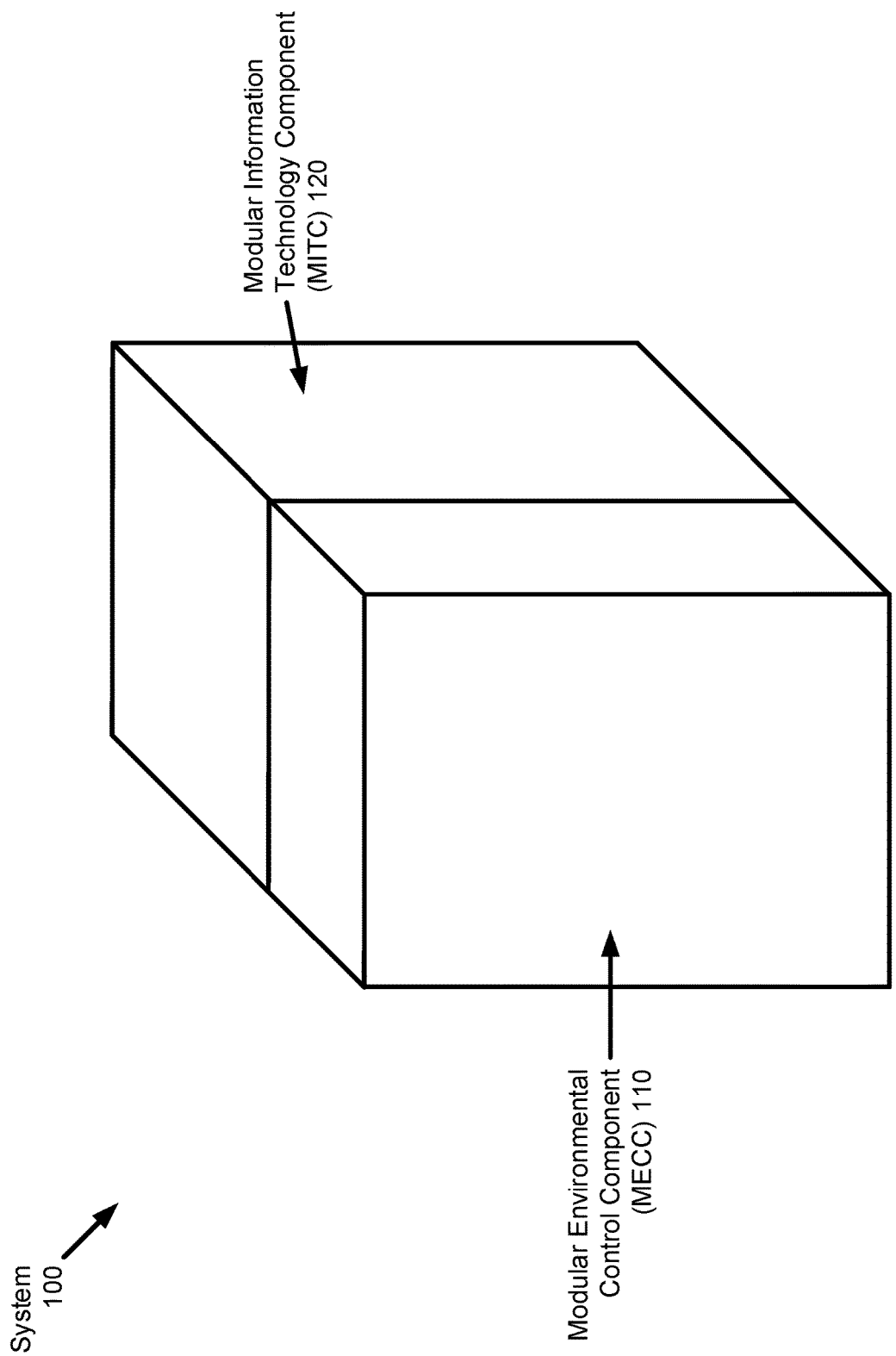
FIG. 1 shows a diagram of a system in accordance with one or more embodiments of the invention.

Specific embodiments of the invention will now be described in detail with reference to the accompanying figures. In the following detailed description of the embodiments of the invention, numerous specific details are set forth in order to provide a more thorough understanding of one or more embodiments of the invention. However, it will be apparent to one of ordinary skill in the art that one or more embodiments of the invention may be practiced without these specific details. In other instances, well-known features have not been described in detail to avoid unnecessarily complicating the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

Throughout this application, elements of figures may be labeled as A to N. As used herein, the aforementioned labeling means that the element may include any number of items, and does not require that the element include the same number of elements as any other item labeled as A to N. For example, a data structure may include a first element labeled as A and a second element labeled as N. This labeling convention means that the data structure may include any number of the elements. A second data structure, also labeled as A to N, may also include any number of elements. The number of elements of the first data structure, and the number of elements of the second data structure, may be the same or different.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

As used herein, the phrase operatively connected, or operative connection, means that there exists between elements/components/devices a direct or indirect connection that allows the elements to interact with one another in some way. For example, the phrase 'operatively connected' may refer to any direct connection (e.g., wired directly between two devices or components) or indirect connection (e.g., wired and/or wireless connections between any number of devices or components connecting the operatively connected devices). Thus, any path through which information may travel may be considered an operative connection.

In general, before shipping a modular data center (MDC) to a customer site, components (e.g., IHSs, modular over-rack components (MORCs), etc.) of the MDC need to be pre-integrated into the MDC for safety purposes. Once the components are pre-integrated, the MDC may then be shipped to the customer site. Typically, components (e.g., IHSs, MORCs, etc.) with mounting points (e.g., compatible components) can be easily pre-integrated into the MDC; however, components (e.g., cooling distribution units (CDUs), cable management towers, etc.) without mounting points (e.g., non-compatible components) cannot be easily pre-integrated into the MDC. In order to pre-integrate non-compatible components, the non-compatible components may need to be redesigned, but redesigning those components requires resource (e.g., engineering, manufacturing, procurement, etc.) intensive efforts.

To address one or more of the aforementioned issues, embodiments of the invention provide a mounting apparatus to pre-integrate non-compatible components into the MDC. More specifically, embodiments of the invention describe how to secure non-compatible components into the MDC without redesigning the non-compatible components. This advantageously provides a flexibility to pre-integrate both compatible and non-compatible components into the MDC without requiring the resource-intensive efforts.

The following describes various embodiments of the invention.

As used herein, an "MDC" includes any facility or a portion of a facility in which computing operations are carried out. An MDC may include IHSs and IHS components coupled together as functional IHSs, in which the IHSs and the functional IHSs are dedicated to serve specific functions or to serve multiple functions. Examples of computing operations may include (but not limited to): information processing, communications, testing, simulations, power distribution and control, operational control, etc.

Turning now to FIG. 1, FIG. 1 shows a diagram of a system (100) in accordance with one or more embodiments of the invention. The system (100) includes an MITC (120) and a modular environmental control component (MECC) (110). The system (100) may include additional, fewer, and/or different components (e.g., modular building blocks) without departing from the scope of the invention. Each component illustrated in FIG. 1 is described below in reference to FIG. 2.1.

Turning now to FIG. 2.1, FIG. 2.1 shows a top view of the system of FIG. 1 in accordance with one or more embodiments of the invention. In an embodiment of the invention shown in FIG. 2.1, the MITC (220) may be a mechanical structure that enables one or more IHSs (230A, 230B), a utility control component (UCC) (240), one or more CDUs (see FIG. 3.1), and one or more MORCs (see FIG. 4) to be disposed within the MITC (220).

In one or more embodiments, while disposing, the IHSs (230A, 230B) and the CDUs may be affixed to a floor (215) within the MITC (220) via standard mechanical mechanisms (e.g., bolts, screws, nuts, studs, etc.). In one or more embodiments, the floor (215) is affixed to a bottom side of the MITC (220). Other mechanical or non-mechanical (e.g., glue, an adhesive tape, etc.) mechanisms for affixing the IHSs (230A, 230B) and the CDUs to the floor (215) may be used without departing from the scope of the invention. Additional details of the floor are described below in reference to FIGS. 3.1-3.3.

In one or more embodiments, a white space within the MITC (220), where the floor (215) is located, may have a functionality to host different types of standard racks (e.g., 4×750 millimeter (mm) wide racks, 5×600 mm wide racks, 5×48 rack unit (RU) racks, etc.) and standard CDUs (e.g., 20×10 RU CDUs, 10×20 RU CDUs, etc.). As a unit of measurement, the RU is equal to 1.75 inches and the RU defines an increment within a standard rack. The white space may also have a functionality to host custom designed racks and CDUs. Both standard (e.g., off-the-shelf) and custom designed racks and CDUs may be pre-integrated into the floor (215) before transportation to the customer site (e.g., a customer location, a customer facility, etc.).

In one or more embodiments, apart from hosting the IHSs (230A, 230B), the white space may also host other components, for example (but not limited to): immersion tanks, uninterruptible power supplies (UPSs), battery racks, cable management towers, etc.

The aforementioned example is not intended to limit the scope of the invention.

In one or more embodiments, while disposing, the MORCs may be affixed to a ceiling (e.g., a top side) of the MITC (220) via the standard mechanical mechanisms. Other mechanical or non-mechanical mechanisms for affixing the MORCs to the ceiling of the MITC (220) may be used without departing from the scope of the invention. Additional details of the MORCs are described below in reference to FIG. 4.

In one or more embodiments, the MITC (220) may be implemented as other types of structures adapted to host, position, orient, and/or otherwise physically, mechanically, electrically, and/or thermally manage the IHSs (230A, 230B), the UCC (240), the CDUs, and the MORCs. In this manner, the MITC (220) may enable the IHSs (230A, 230B), the UCC (240), the CDUs, and the MORCs to be densely packed without negatively impacting the operation of the IHSs (230A, 230B), the UCC (240), the CDUs, and the MORCs.

In one or more embodiments, an IHS (e.g., 230A) may include a rack and any number of computing devices. Additional details of the IHS are described below in reference to FIGS. 2.2 and 2.3.

In one or more embodiments, the UCC (240) is integrated within the MITC (220) to support different types of IHSs, in which the UCC-integrated MITC is manufactured as a monolithic system. This implies that the UCC (240) is not a separate, standalone component.

In one or more embodiments, the UCC (240) may include one or more physical devices (e.g., panels, units, switchboards, etc.) that may provide functionality, for example (but not limited to): to detect a temperature within a system, to detect fire/smoke within a system, to suppress fire/smoke within a system, to provide an access control to a component, to manage a power distribution to a component, to manage a temperature within a system, etc.

The aforementioned example is not intended to limit the scope of the invention.

In one or more embodiments, the UCC (240) may include an environmental control component (ECC) control panel (not shown) that is configured to manage a temperature within the system (e.g., 100, FIG. 1) and to provide heating and/or cooling control services. The heating and/or cooling control services may include, for example (but not limited to): (i) obtaining information relating to a temperature of one or more components within the system (e.g., 100, FIG. 1), where the information may be obtained through a number of temperature sensors (discussed below) within the system (e.g., 100, FIG. 1), (ii) determining whether the temperature within the system (e.g., 100, FIG. 1) is below or above an appropriate operating temperature level (e.g., above 0° C.), (iii) initiating, based on the determination in (ii), a heating process (e.g., activating a heater component within a MECC (210)) to bring the IHSs (230A, 230B) into their designed operating temperature levels, (iv) initiating, based on the determination in (ii), a cooling process (e.g., activating a fluid mixture unit within the MECC (210)) to bring the IHSs (230A, 230B) into their designed operating temperature levels, (v) preventing damage (e.g., thermal runaway) to the heater component in the event of overheating, etc.

While described as a physical device, the ECC control panel may be implemented as a logical entity (e.g., a program executing using a number of printed circuit board components (not shown)). For example, an IHS (e.g., 230A) may host a program that provides the functionality of the ECC control panel.

In one or more embodiments, the ECC control panel may include one or more temperature sensors. The ECC control panel may include other types of sensors (e.g., humidity sensors, vibration sensors, corrosion sensors, differential pressure sensors, etc.) without departing from the scope of the invention. In one or more embodiments, one end of a temperature sensor may be operatively connected to at least one of the components (e.g., IHSs (230A, 230B)) within the system (e.g., 100, FIG. 1) to detect a temperature within the system (e.g., 100, FIG. 1). The other end of the temperature sensor may be operatively connected to the ECC control panel, in which the ECC control panel is configured to manage the components based on the temperature within the system (e.g., 100, FIG. 1).

In one or more embodiments, the UCC (240) may include a power distribution control unit (not shown) that is configured to determine which component(s) within the system (e.g., 100, FIG. 1) receive power from a modular power supply component (not shown). For example, when the heater component needs to be activated, the modular power supply component may be instructed (e.g., by the power distribution control unit) to distribute power to the heater component. As yet another example, the modular power supply component may be instructed to distribute power to the IHSs (230A, 230B).

In one or more embodiments, the modular power supply component may be designed by considering geographic factors of the customer site and custom requirements of the customer. The factors and the requirements may include, for example (but not limited to): a hurricane rating of a location, a required number of UPSs to support an operation, a required number of physical devices in a MECC, a required resiliency of a MECC, a required input power frequency, a required input voltage, etc.

The aforementioned examples are not intended to limit the scope of the invention.

In one or more embodiments, the modular power supply component may obtain customer facility's power (which comes from a centralized power station) and then may distribute the power (i.e., provide the power) to one or more components of the system (e.g., 100, FIG. 1).

In one or more embodiments, the modular power supply component may provide DC power to the components. The modular power supply component may include functionality to convert AC power (obtained from the centralized power station) to DC power.

In one or more embodiments, the modular power supply component may provide "N" or "2×N" power supply resiliency. In one or more embodiments, "N" resiliency may refer to having an exact number of components to operate. For example, if the system (e.g., 100, FIG. 1) needs "N" components to operate and if the system (e.g., 100, FIG. 1) has "N" components, this means that the system (e.g., 100, FIG. 1) has "N" resiliency. As yet another example, if the system (e.g., 100, FIG. 1) has "2×N" power supply resiliency, this means that the modular power supply component has a functionality to provide twice the amount of power needed for the system (e.g., 100, FIG. 1).

Further, if the modular power supply component provides a single power supply feed, then the system (e.g., 100, FIG. 1) will have a low level of resiliency. If there is an additional power supply feed (e.g., a separate busway), then the system (e.g., 100, FIG. 1) will have a high level of resiliency. Having an additional power capacity (e.g., having a redundant UPS, having a redundant battery, etc.) may ensure that the system (e.g., 100, FIG. 1) has no downtime while performing a service maintenance or experiencing a failure (e.g., a hardware failure, a software failure, etc.).

In one or more embodiments, apart from the modular power supply component, the power distribution control unit may include one or more backup power resources (e.g., batteries) to support an uninterrupted service (e.g., a temperature detection service, a power distribution management service, etc.) of the UCC (240).

In one or more embodiments, the UCC (240) may also include an access control unit (not shown) that is configured to control one or more security devices that are placed at various locations on the system (e.g., 100, FIG. 1). In one or more embodiments, a security device may be, for example (but not limited to): a padlock, a badge reader, an electrified mortise lock, a biometric reader-based access contact, etc. By using, for example, a biometric reader-based access contact, the access control unit may control access provided by access doors (ADs, discussed below) (258A-258C).

The aforementioned example is not intended to limit the scope of the invention.

In one or more embodiments, the access control unit may include a blank space (with power) to plug-in third-party security devices. If a customer has an existing security system at a customer site, the customer may install (e.g., mount) the existing security system within the blank space. In this manner, the customer may have a flexibility to use built-in security devices of the UCC (240) and/or to use the existing security system for access control.

As used herein, "mounting" a particular component on another component refers to positioning the particular component to be in physical contact with the other component, such that the other component provides structural support, positioning, structural load transfer, stabilization, shock absorption, some combination thereof, or the like with regard to the particular component.

Those skilled in the art will appreciate that while the IHSs (230A, 230B) and the UCC (240) are shown as located on a particular side of the MITC (220), the IHSs (230A, 230B) and the UCC (240) may be located on any other side of the MITC (220) without departing from the scope of the invention.

In one or more embodiments, the MITC (220) includes the AD (258A). Similarly, the UCC (240) includes the AD (258B). In one or more embodiments, the ADs (258A, 258B) may be walk-in doors or walk-up doors. For example, as a walk-in door, the AD (258A) may permit user access to the UCC (240). As yet another example, as a walk-in door, the AD (258B) may permit user access to an internal environment of the MITC (220).

The aforementioned examples are not intended to limit the scope of the invention.

In one or more embodiments, a walk-up door may be a mechanical "reach through" structure, in which "walk-up" refers to not being able to walk inside of, for example, the MECC (210). Said another way, the walk-up door (258C) has not enough space for a customer to step inside of the MECC (210). However, using the walk-up door (258C), the customer may access substantially a portion of an ECC (e.g., a direct expansion (DX) coil (245)) to perform a service type of event.

In one or more embodiments, the service type of event may include, for example (but not limited to): changing an actuator, changing a filter, changing a sensor, etc. In one or more embodiments, because the customer not being able to walk inside of the MECC (210), the customer may perform the event while standing outside of the MECC (210).

The aforementioned examples are not intended to limit the scope of the invention.

In one or more embodiments, a walk-in door may be a mechanical "walk through" structure, in which "walk-in" refers to being able to walk inside of, for example, the MECC (210) to perform at least a service type of event. In one or more embodiments, the walk-in door has a greater depth than the walk-up door. Said another way, the walk-in door has enough space (e.g., a walk-in space) for a customer to step inside of the walk-in door.

In one or more embodiments, for example, the AD (258A) includes a handle (not shown) that makes easier to open or close the AD (258A) to walk through or reach through the internal environment of the MITC (220). In this manner, the customer may perform a service type of event without standing outside of the MITC (220).

The aforementioned example is not intended to limit the scope of the invention.

In one or more embodiments, the ADs (258A-258C) may be wicket doors (e.g., a door in a door), in which the ADs (258A-258C) both include a person door and a rack door. This means that the ADs (258A-258C) are big enough to pass a rack (not shown) through the ADs (258A-258C). In one or more embodiments, dotted arcs show an inward rotation or an outward rotation of the ADs (258A-258C).

Those skilled in the art will appreciate that while the ADs (258A, 258B) are shown as located on a rear side of the MITC (220) and a front side of the UCC (240), respectively, the ADs (258A, 258B) may be located on any other side of the MITC (220) and the UCC (240) without departing from the scope of the invention.

In one or more embodiments, the MITC (220) includes a connection interface, in which the connection interface is affixed to a pairing end of the MITC (220). The pairing end of the MITC (220) refers to a portion of the MITC (220) that can be paired with another component (e.g., the MECC (210)). In one or more embodiments, the connection interface of the MITC (220) includes mechanical and electrical connection components (MECCOMs) (250B). The connection interface of the MITC (220) also includes built-in airflow connection components.

In one or more embodiments, the mechanical connection components keep the MECC (210) connected to the MITC (220). The mechanical connection components also provide structural support to the MECC (210) and to the MITC (220) in case of a seismic event. The mechanical connection components may be, for example (but not limited to): steel plates with bolted connections, mechanical hard-stop components, sealing components, etc.

In one or more embodiments, "connected" may refer to "directly connected", in which there is a seal in between, for example, the connection interface of the MITC (220) and a connection interface of the MECC (210) (discussed below). Alternatively, "connected" may refer to "connected via one or more physical components in between". For example, the connection interface of the MITC (220) is connected to the connection interface of the MECC (210), in which at least one physical component is mechanically touching the connection interfaces.

In one or more embodiments, the electrical connection components may transmit or receive power and data (e.g., temperature data, humidity data, etc.) to or from the MECC (210). For example, the UCC (240) may collect a temperature of one or more components within the MITC (220) as temperature data. Based on the collected data, the UCC (240) may activate or deactivate the MECC (210) using the electrical connection components.

In one or more embodiments, the airflow connection components may be ducting components that allow using either standard or custom designed MECCs. The airflow connection components may change (e.g., twist) a direction of an airflow formed between the MECC (210) and the MITC (220). For example, the MECC (210) may include a cold air ducting component and a hot air ducting component. The cold air ducting component may supply cold air into the MITC (220). The hot air ducting component may remove hot air from the MITC (220) and may deliver the hot air to the MECC (210).

The aforementioned examples are not intended to limit the scope of the invention.

As used herein, a "ducting component" includes any tube, pipe, conduit, or a combination thereof, that has one or more passageways through which a fluid or a gas can be conveyed. Examples of materials for a ducting component may include a cloth, a fabric, an extruded metal, a sheet metal, a polymer, or a combination thereof. A passageway of a ducting component may have any size and shape. The cross-section of a ducting component may be square, round, ovate, rectangular, or irregular. Further, a passageway of a ducting component may have a constant or changing cross-section, or a cross-section that changes over the length of the passageway.

In one or more embodiments, an area (e.g., height×width) enclosed by the connection interface of the MITC (220) is equal to an area enclosed by the connection interface of the MECC (210). In this manner, an end-to-end pairing between the MITC (220) and the MECC (210) may be installed for compatible mechanical, electrical, and airflow connections.

The MECC (210) may include one or more physical devices (e.g., ECCs) that alter characteristics (e.g., airflow directions, humidity of air, and temperature levels, etc.) of the internal environment of the MITC (220) at a macroscopic level. The physical devices may also ensure reliability of the IHSs (230A, 230B) and the UCC (240). In one or more embodiments, the physical devices may be affixed to a floor (e.g., a bottom side) of the MECC (210). In one or more embodiments, a physical device may be, for example (but not limited to): a fan (255), a DX coil (245), a fluid mixture unit, a heater component, an immersion cooling component, etc.

The aforementioned example is not intended to limit the scope of the invention.

In some cases, the system (e.g., 100, FIG. 1) may be deployed to environments that result in the temperature levels of the IHSs (230A, 230B) and the UCC (240) being outside of their designed operating temperature levels. For example, the IHSs (230A, 230B) may be designed to operate at temperature levels above 0° C. When the system (e.g., 100, FIG. 1) is deployed to an environment with harsh conditions (e.g., −40° C.-60° C.), the IHS (230A, 230B) may not operate properly and, in certain scenarios, may be damaged. To prevent the aforementioned issue, depending on environmental conditions, the physical devices either cool or heat the internal environment of the MITC (220). In this manner, stability and functionality of the IHSs (230A, 230B) and the UCC (240) may be preserved.

In one or more embodiments, as a gas mover, the fan (255) may be able to change a rate of gases being taken into and expelled from the IHSs (230A, 230B) and the UCC (240). As a refrigerant-based cooling technology, the DX coil (245) may cool the internal environment of the MITC (220) using a condensed refrigerant liquid (e.g., liquid nitrogen, hydrofluorocarbons (HFCs), etc.). In this technology, the refrigerant may expand to generate a cooling effect in the DX coil (245) that is in direct contact with a conditioned air, which will be supplied to the internal environment of the MITC (220).

In one or more embodiments, as a liquid cooling component, the fluid mixture unit may pump cooled fluid mixture (e.g., a mixture of water and glycerol) throughout hardware components (not shown) of the IHSs (230A, 230B) and the UCC (240). An absorbed air by the fluid mixture may then be transferred to an external environment of the MITC (220). Similar to refrigerant-based cooling technology, the fluid mixture unit may also use a DX coil; however, instead of using a refrigerant, the fluid mixture unit uses the fluid mixture. In one or more embodiments, glycerol may behave like an antifreeze liquid, in which the fluid mixture may operate at temperatures below 0° C.

In one or more embodiments, the MECC (210) may also take advantage of a cooling infrastructure that is already built-in at a customer site. For example, the MECC (210) may use a chilled water loop that is already available at the customer site.

As used herein, an "infrastructure" means system, components, or elements of a system that provide resources for a computing device, such as electrical power, data exchange capability with external systems, air, heat removal, and environmental control.

In one or more embodiments, the heater component may bring hardware components of the IHSs (230A, 230B) and the UCC (240) into their appropriate operating temperature levels (e.g., above 0° C.) when necessary. To initiate a heating process, the heater component may obtain a required power from the modular power supply component. The heater component may be made of silicon rubber, any other material, and/or any combination thereof that enables the heater component to perform its functions. Those skilled in the art will appreciate that the heater component may be supplied with power directly or indirectly (e.g., via a heating control component, a printed circuit board, etc.) without departing from the scope of the invention.

In one or more embodiments, the heater component has a number of surfaces that is heated and when air passes through the surfaces, an induced heat may be transferred from the heater component to the volume of air drawn into the internal environment of the MITC (220). In one or more embodiments, a number of heat sinks (not shown) may be used to provide a uniform distribution of heated volume of air drawn into the internal environment of the MITC (220) through their fins, in which a bottom portion of the number of heat sinks is affixed to the heater component. In this manner, a surface area of the heater component may be expanded indirectly to increase an efficiency of the heater component.

In one or more embodiments, the MECC (210) may provide "N+1" or "N+2" heating and/or cooling resiliency. In one or more embodiments, "N+1" cooling resiliency may indicate that even if one of the physical devices is deactivated (because of a service maintenance), the IHSs (230A, 230B) may still operate. For example, the MECC (210) has four fans and the MECC (210) has "N+1" resiliency. In this case, the required number of fans to support operation of the IHSs (230A, 230B) is three and the MECC (210) has a redundant fan. Having additional heating and/or cooling capacity (e.g., having a redundant fan, having a redundant heater component, etc.) may ensure that the IHSs (230A, 230B) has no downtime while performing a service maintenance or experiencing a failure.

In one or more embodiments, a power usage effectiveness (PUE) value of a component (e.g., an ECC, an IHS, etc.) at a data center indicates how energy efficient the component is. For example, as an ideal case, if a PUE value of an ECC is equal to one, this means that the ECC uses 100% of an input power that is provided to the ECC. In general, a PUE value of an ECC at a traditional data center is on average 1.57 (e.g., 64% effectiveness). Comparing to the PUE value of the ECC at the traditional data center, a PUE value of the MECC (210) is on average 1.01 (e.g., 99% efficiency)-1.043 (e.g., 95% efficiency), depending on where the system (e.g., 100, FIG. 1) is deployed. For example, if the system (e.g., 100, FIG. 1) is deployed to a hot environment (e.g., Phoenix, AZ), the PUE value of the MECC (210) may be 1.043. As yet another example, if the system (e.g., 100, FIG. 1) is deployed to a mild (e.g., neither hot nor cold) environment (e.g. San Diego, CA), the PUE value of the MECC (210) may be 1.01.

The aforementioned example is not intended to limit the scope of the invention.

In one or more embodiments, the MECC (210) supplies cold air (shown with a dashed line arrow) to the internal environment of the MITC (220) (including the UCC (240)) via the built-in airflow connection components. The MECC (210) also removes hot air (shown with a solid line arrow) from the internal environment of the MITC (220) (including the UCC (240)) via the built-in airflow connection components. In one or more embodiments, the dashed line and the solid line arrows inside of the MITC (220) may be referred to as a "cold aisle" and a "hot aisle", respectively.

The cold aisle may refer to an area (e.g., a space) in which conditioned (e.g., cold) air is introduced to a front side of the IHSs (230A, 230B) and to the UCC (240) to remove heat. The cold air may also be introduced to other components located within the internal environment of the MITC (220) without departing from the scope of the invention.

The hot aisle may refer to an area in which conditioned (e.g., hot) air is removed from a rear side of the IHSs (230A, 230B) and from the UCC (240) for the reliability of the IHSs (230A, 230B) and the UCC (240). The hot air may also be removed from other components located within the internal environment of the MITC (220) without departing from the scope of the invention.

In one or more embodiments, similar to MITC (220), the MECC (210) includes the AD (258C). In one or more embodiments, the AD (258C) may be a walk-in door or a walk-up door (as discussed above). For example, as a walk-in door, the AD (258C) may permit user access to the MECC (210).

The aforementioned example is not intended to limit the scope of the invention.

Those skilled in the art will appreciate that while the AD (258C) is shown as located on a right side of the MECC (210), the AD (258C) may be located on any other side of the MECC (210) without departing from the scope of the invention.

In one or more embodiments, as being separate components and as having separate ADs, once paired, the MITC (220) and the MECC (210) provide an additional security measure to the user access. For example, user 1 has access to the AD (258C) and user 2 has access to the ADs (258A-258C). In this case, because user 2 has access to all ADs, user 2 can access to the UCC (240), the MITC (220), and the MECC (210). However, because user 1 has access only to the AD (258C), user 1 cannot access to the UCC (240) and to the MITC (220).

The aforementioned example is not intended to limit the scope of the invention.

In one or more embodiments, similar to the MITC (220), the MECC (210) includes a connection interface, in which the connection interface is affixed to a pairing end of the MECC (210). The pairing end of the MECC (210) refers to a portion of the MECC (210) that can be paired with another component (e.g., the MITC (220)). In one or more embodiments, similar to the MITC (220), the connection interface of the MECC (210) includes MECCOMs (250A). The connection interface of the MECC (210) also includes the built-in airflow connection components.

In one or more embodiments, the MITC (220) and the MECC (210) are oriented in a same direction. Further, a double-headed arrow shows modularity of the system (e.g., 100, FIG. 1), in which the MECC (210) may be attached to, or detached from the MITC (220) along the same direction.

Those skilled in the art will appreciate that while the IHSs (230A, 230B) are oriented in parallel to the MECCOMs (250B), the IHSs (230A, 230B) may be oriented in any direction without departing from the scope of the invention.

In one or more embodiments, the end-to-end and medium form factor (e.g., medium shape) of the MDC (the system (e.g., 100, FIG. 1)) described in FIGS. 1 and 2.1 makes the system (e.g., 100, FIG. 1) deployable to, for example (but not limited to): space-unlimited locations, remote locations, etc. The space-unlimited locations may be, for example (but not limited to): university campuses, research and development locations, etc. The remote locations (e.g., edge locations) may be locations that are away from specialized IT and security personnel to maintain an operation of the MDC.

Providing multiple functionalities and fitting these functionalities into the medium form factor make formation, deployment, and operation of the end-to-end MDC easier for a customer that needs higher computing power. These functionalities also make possible to move from centralized cloud computing to decentralized edge computing. These functionalities may include, for example (but not limited to): a pre-integrated and ready-to-use IHS, an ability to plug into an existing security system, multiple ECC options, a high power resiliency, an optimized power distribution, higher power density within a data center, an easy service access, flexibility to support third-party components, a customer-specific component design, etc.

Further, a physical and functional split between the MECC (210) and the MITC (220) enables a variety of cooling technologies, capacities, and resiliencies to be paired with a variety of power capacities, resiliencies, and IHS technologies.

Turning now to FIG. 2.2, FIG. 2.2 shows a diagram of the IHS (230A) in accordance with one or more embodiments of the invention. The IHS (230A) may include a rack (260) and any number of computing devices (e.g., 270).

In one or more embodiments, the rack (260) may be a mechanical structure that enables the computing devices to be positioned with respect to one another. For example, the rack (260) may be a mountable enclosure that enables the computing devices to be disposed within the rack (260). The rack (260) may be implemented as other types of structures adapted to host, position, orient, and/or otherwise physically, mechanically, electrically, and/or thermally manage the computing devices. By managing the computing devices, the rack (260) may enable the computing devices to be densely packed in a space without negatively impacting the operation of the IHS (230A).

In one or more embodiments, the rack (260) includes six sides (i.e., top, bottom, right, left, front, and rear), in which a first set of mounting holes (MHs) (265A-265D) are placed at the top side of the rack (260). Further, a second set of MHs (e.g., 266A, 266B, etc.) are placed at the front side and at the rear side of the rack (260). Additional details of the MHs are described below in reference to FIGS. 3.1 and 4.

In one or more embodiments, a computing device (e.g., 270) may be a mechanical structure for housing components of the IHS (230A). For example, the computing device (e.g., 270) may be implemented as a rack-mountable enclosure for housing components of the IHS (230A). The computing device (e.g., 270) may be adapted to be disposed within the rack (260) and/or utilize services provided by the rack (260) and/or other components available in the system (e.g., 100, FIG. 1).

In one or more embodiments, a computing device positioned into a pre-integrated rack may be ready-to-use (e.g., pre-configured with software, hardware, etc.) when deployed to the customer site. However, the customer may alter a configuration of the pre-configured computing device after the deployment. For example, the customer may increase memory capacity of the computing device after the deployment. As yet another example, the customer may increase processor capacity of the computing device after the deployment.

The aforementioned examples are not intended to limit the scope of the invention.

In one or more embodiments, a set of isolators (see FIGS. 3.2, 3.3, and 4) may be attached to the components (e.g., the IHSs (e.g., 230A, 230B, FIG. 2.1), the floor (e.g., 320, FIG. 3.2), the MORC (e.g., 410, FIG. 4), etc.) of the system (e.g., 100, FIG. 1) to make sure that the components are ready-to-use when they deployed to the customer site. In one or more embodiments, the set of isolators provides a shock isolation to the components such that the components may be protected from any damage (e.g., a vibrational damage). Additional details of the set of isolators are described below in reference to FIGS. 3.2, 3.3, and 4.

Turning now to FIG. 2.3, FIG. 2.3 shows a diagram of the computing device (270) in accordance with one or more embodiments of the invention. In one or more embodiments, similar to the rack (260), the computing device (270) includes six sides, in which air drawn into from a front side of the computing device (e.g., via an air inlet (280)) and expelled from the rear side of the computing device (e.g., via one or more ECCs). An airflow direction is shown with a dashed line arrow (cold air) and a solid line arrow (hot air). In general, air incoming from the front side of the computing device (270) is cooler than air outgoing from the rear side of the computing device (270).

In one or more embodiments, to provide services, the computing device (270) may utilize resources provided by a number of hardware components hosted within the computing device (270). The hardware components may be, for example (but not limited to): processors, non-persistent storage devices, printed circuited boards, persistent storage devices, peripheral components interconnects, special purpose hardware components, etc. In one or more embodiments, some of the hardware components may be omitted or additional hardware components may be added based on the services provided by the computing device (270).

The aforementioned example is not intended to limit the scope of the invention.

As used herein, "computing" refers to any operations that may be performed by a computer, including (but not limited to): computation, data storage, data retrieval, communications, etc.

As used herein, a "computing device" includes any of various devices in which a computing operation may be carried out. A computing device may be, for example (but not limited to): a compute IHS component, a storage IHS component, a network device, a telecommunications component, etc.

The aforementioned examples are not intended to limit the scope of the invention.

In one or more embodiments, the medium form factor of the system described in FIG. 2.1 may increase a PUE value of the computing device (270). For example, because the system described in FIG. 2.1 includes a separate cooling and/or heating unit (210), the computing device (270) may not have a fan and/or a heating component. In this manner, the computing device (270) may become more power dense and power-efficient.

Turning now to FIG. 3.1, FIG. 3.1 shows a diagram of a portion of the system of FIG. 1 in accordance with one or more embodiments of the invention. In an embodiment of the invention shown in FIG. 3.1, the embodiment includes one or more IHSs (e.g., 305A, 305B, etc.), one or more CDUs (e.g., 310), a floor (320), one or more bottom rack mounting components (RMCs) (e.g., 340A), and one or more bottom cooling distribution unit mounting components (CDUMCs) (e.g., 325A). The floor (320) may be the same as the floor (215) as discussed above in reference to FIG. 2.1. Similarly, the IHS (305A) may be the same as the IHS (230A) as discussed above in reference to FIG. 2.1.

In one or more embodiments, the floor (320) includes two floor track apparatuses (FTAs) (330A, 330B), in which each of the FTAs (330A, 330B) includes a set of MHs (e.g., 335A, 335C, etc.). For example, the FTA (330A) includes a first set of MHs (e.g., 335C, 335D, etc.) and the FTA (330B) includes a second set of MHs (e.g., 335A, 335B, etc.). In one or more embodiments, similar to the rack (e.g., 260, FIG. 2.2), the floor (320) includes six sides, in which the FTA (330A) is located on the right side of the floor (320) and the FTA (330B) is located on the left side of the floor (320).

In one or more embodiments, the FTA (330A) extends along the entire right side of the floor (320). Similarly, the FTA (330B) extends along the entire left side of the floor (320). Further, an orientation of the right side of the floor (320) and an orientation of the left side of the floor (320) are parallel to each other.

Those skilled in the art will appreciate that while the FTAs (330A, 330B) are shown as located on the right and left sides of the floor (320), the FTAs (330A, 330B) may be located on any other two sides (that are parallel to each other) of the floor (320) without departing from the scope of the invention.

In one or more embodiments, the first set of MHs (e.g., 335C, 335D, etc.) extends along the length of the FTA (330A). Said another way, the first set of MHs (e.g., 335C, 335D, etc.) is aligned along the entire right side of the floor (320). Similarly, the second set of MHs (e.g., 335A, 335B, etc.) extends along the length of the FTA (330B). Said another way, the second set of MHs (e.g., 335A, 335B, etc.) is aligned along the entire left side of the floor (320). In one or more embodiments, because the set of MHs (e.g., 335A, 335C, etc.) are either aligned along the entire right side of the floor (320) or along the entire left side of the floor (320), the FTAs (330A, 330B) may be referred to as "rails".

In one or more embodiments, in order to secure (e.g., mount) different types (and different sizes) of components (discussed below) to the floor (320), the set of MHs (e.g., 335A, 335C, etc.) are positioned (e.g., spaced) along the length of the FTAs (330A, 330B) with a specific pattern (e.g., an optimal pattern). In an embodiment of the invention shown in FIG. 3.1, the set of MHs (e.g., 335A, 335C, etc.) is spaced at 150 mm apart (i) to secure any size of IHS and/or CDU to the floor (320) and (ii) to be aligned with any size of slotted hole (SH) (e.g., 345A, 345D, etc.) of a bottom CDUMC (e.g., 325A) and of a bottom RMC (e.g., 340A). With 150 mm spacing between the set of MHs (e.g., 335A, 335C, etc.), the SHs (e.g., 345A, 345D, etc.) will always be aligned with at least two MHs, in which "two" is the minimum number of MHs required to secure a component to the floor (320).

For example, without redesigning the floor (320), an 800 mm wide rack and a 750 mm wide rack may be secured to any location on the floor (320) using different types of bottom RMCs. In this example, (i) the 800 mm wide rack may be secured using a first type of bottom RMC, in which the SHs of the first type of bottom RMC align with four MHs, and (ii) the 750 mm wide rack may be secured using a second type of bottom RMC, in which the SHs of the second type of bottom RMC aligns with three MTh.

Continuing with the example discussed above, a 600 mm wide rack may also be secured to any location on the floor (320) using a third type of bottom RMC, in which the SHs of the third type of bottom RMC align with two MHs. In one or more embodiments, while the width of the 600 mm wide rack determines how many MTh will be aligned with the SHs of the third type of bottom RMC, a position of the SHs also determines how many MHs will be aligned with the SHs of the third type of bottom RMC. For example, if the SHs are sparsely positioned along a second portion (discussed below) of the third type of bottom RMC, the SHs may be aligned with two MTh. As yet another example, if the SHs are closely positioned along the second portion of the third type of bottom RMC, the SHs may be aligned with four MHs. In this case, similar to the 800 mm wide rack, the 600 mm wide rack may also be secured to the floor (320) via four MTh.

The aforementioned examples are not intended to limit the scope of the invention.

Similarly, for example, without redesigning the floor (320), an 800 mm wide CDU and a 750 mm wide CDU may be secured to any location on the floor (320) using different types of bottom CDUMCs. In this example, (i) the 800 mm wide CDU may be secured using a first type of bottom CDUMC, in which the SHs of the first type of bottom CDUMC align with four MHs, and (ii) the 750 mm wide CDU may be secured using a second type of bottom CDUMC, in which the SHs of the second type of bottom CDUMC align with three MHs.

Continuing with the example discussed above, a 600 mm wide CDU may also be secured to any location on the floor (320) using a third type of bottom CDUMC, in which the SHs of the third type of bottom CDUMC align with two MTh. In one or more embodiments, while the width of the 600 mm wide CDU determines how many MHs will be aligned with the SHs of the third type of bottom CDUMC, a position of the SHs also determines how many MTh will be aligned with the SHs of the third type of bottom CDUMC. For example, if the SHs are sparsely positioned along a second portion of the third type of bottom CDUMC, the SHs may be aligned with two MHs. As yet another example, if the SHs are closely positioned along the second portion of the third type of bottom CDUMC, the SHs may be aligned with four MTh. In this case, similar to the 800 mm wide CDU, the 600 mm wide CDU may also be secured to the floor (320) via four MHS.

The aforementioned examples are not intended to limit the scope of the invention.

Those skilled in the art will appreciate that while the 800 mm wide, 750 mm wide, and 600 mm wide racks and CDUs are considered above, any other standard and custom designed components may be secured to the floor (320) using the FTAs (330A, 330B) without departing from the scope of the invention.

In one or more embodiments, the floor (320) includes one or more portions (e.g., sections) (see FIG. 3.2), in which a second portion of the floor (320) is elevated relative to a first portion and a third portion of the floor (320). In one or more embodiments, (i) the IHSs (305A, 305B) and the CDU (310) are located on the second portion of the floor (320), (ii) the FTA (330A) is located on (e.g., integrated into) the first portion of the floor (320), and (iii) the FTA (330B) is located on the third portion of the floor (320).

In one or more embodiments, apart from hosting the IHSs (305, 305B) and the CDU (310), the second portion may also host other components that are compatible or non-compatible. The compatible components may be, for example (but not limited to): battery racks, network racks, etc. The non-compatible components may be, for example (but not limited to): immersion tanks, UPSs, transformers, cable management towers, etc. Further, the floor (320) may be, for example (but not limited to): an aluminum floor, a steel floor, etc.

The aforementioned examples are not intended to limit the scope of the invention.

In one or more embodiments, in order to secure (e.g., to restrain) any size of compatible component to the floor (320), each bottom RMC may be a bracket (e.g., an L bracket) that includes two portions. For example, a first portion of the bottom RMC (340A) refers to a portion of the bottom RMC (340A) that is secured to the second set of MHs (e.g., 335A, 335B, etc.) to affix the IHS (305A) to the floor (320). A second portion of the bottom RMC (340A) refers to a portion of the bottom RMC (340A) that is secured to the second set of MHs (e.g., 266A, 266B, FIG. 2.2) of the IHS (305A) to secure the IHS (305A) to the bottom RMC (340A) itself. Additional details of the second portion of the bottom RMC are described below in reference to FIG. 3.3.

In one or more embodiments, the first portion of the bottom RMC (340A) includes the SHs (345C, 345D) that allow a first set of floor track (FT) bolts (350C, 350D) to pass through and interface with the second set of MHs (e.g., 335A, 335B, etc.). When the SHs (345C, 345D) are aligned with the second set of MHs (e.g., 335A, 335B, etc.), the first set of FT bolts (350C, 350D) is used to secure the bottom RMC (340A) to the FTA (330B). In this manner, a front side of the IHS (305A) is affixed to the floor (320).

Similarly, in order to secure any size of non-compatible component to the floor (320), each bottom CDUMC may be a hook-integrated bracket (e.g., a hook-integrated L bracket) that includes two portions. For example, a first portion of the bottom CDUMC (325A) refers to a portion of the bottom CDUMC (325A) that is secured to the second set of MHs (e.g., 335A, 335B, etc.) to affix the CDU (310) to the floor (320). A second portion of the bottom CDUMC (325A) refers to a portion of the bottom CDUMC (325A) that is secured (e.g., attached) to a first inner component (e.g., 327B, FIG. 3.2) located inside of the CDU (310) to secure the CDU (310) to the bottom CDUMC (325A) itself. Additional details of the bottom CDUMC and the first inner component are described below in reference to FIG. 3.2.

In one or more embodiments, the first portion of bottom CDUMC (325A) includes the SHs (345A, 345B) that allow a second set of FT bolts (350A, 350B) to pass through and interface with the second set of MHs (e.g., 335A, 335B, etc.). When the SHs (345A, 345B) are aligned with the second set of MHs (e.g., 335A, 335B, etc.), the second set of FT bolts (350A, 350B) is used to secure the bottom CDUMC (325A) to the FTA (330B). In this manner, a front side of the CDU (310) is affixed to the floor (320).

In one or more embodiments, a second bottom RMC (not shown) and a third set of FT bolts (not shown) are used to affix a rear side of the IHS (305A) to the floor (320). Similar to the bottom RMC (340A), the second bottom RMC may include a first portion and a second portion (as described above). Further, a second bottom CDUMC (not shown) and a fourth set of FT bolts (not shown) are used to affix a rear side of the CDU (310) to the floor (320). Similar to the bottom CDUMC (325A), the second bottom CDUMC may include a first portion and a second portion (as described above).

In one or more embodiments, the bottom RMCs (e.g., 340A) may provide one or more functionalities to the IHS (305A). For example, the bottom RMCs (e.g., 340A) may act as mechanical hard-stop components and may provide structural support to the IHS (305A) in case of a seismic event. As yet another example, the bottom RMCs (e.g., 340A) may also provide structural support to the IHS (305A) to keep the IHS (305A) connected to the floor (320).

The aforementioned examples are not intended to limit the scope of the invention.

In one or more embodiments, in addition to being mechanical hard-stop components, the bottom RMCs (e.g., 340A) may act as air containment components, in which the bottom RMCs (e.g., 340A) may segregate cold air in a cold aisle from hot air in a hot aisle (or from other air in the MITC (e.g., 210, FIG. 2.1)). In this manner, the bottom RMCs (e.g., 340A) may (i) increase cooling efficiency of the MECC (e.g., 210, FIG. 2.1), (ii) reduce the amount of time of the MECC (e.g., 210, FIG. 2.1) needs to operate, (iii) reduce recirculation (e.g., mixing of hot air with cold air), (iv) bypass airflow from one aisle to another aisle, (v) improve usability and serviceability of the computing devices (e.g., 270, FIG. 2.2), (vi) enhance thermal management of the internal environment of the MITC (e.g., 220, FIG. 2.1), (vii) prevent damage to the hardware components of the computing devices (e.g., 270, FIG. 2.2), and (viii) improve functionality of the hardware components of the computing devices (e.g., 270, FIG. 2.2). Additional details of air containment and air containment components are described below in reference to FIG. 4.

Similarly, the bottom CDUMCs (e.g., 325A) may provide one or more functionalities to the CDU (310). For example, the bottom CDUMCs (e.g., 325A) may act as mechanical hard-stop components and may provide structural support to the CDU (310) in case of a seismic event. As yet another example, the bottom CDUMCs (e.g., 325A) may also provide structural support to the CDU (310) to keep the CDU (310) connected to the floor (320).

The aforementioned examples are not intended to limit the scope of the invention.

In one or more embodiments, in addition to being mechanical hard-stop components, the bottom CDUMCs (e.g., 325A) may act as air containment components, in which the bottom CDUMCs (e.g., 325A) may segregate cold air in a cold aisle from hot air in a hot aisle (or from other air in the MITC (e.g., 210, FIG. 2.1)). In this manner, the bottom CDUMCs (e.g., 325A) may (i) increase cooling efficiency of the MECC (e.g., 210, FIG. 2.1), (ii) reduce the amount of time of the MECC (e.g., 210, FIG. 2.1) needs to operate, (iii) reduce recirculation (e.g., mixing of hot air with cold air), (iv) bypass airflow from one aisle to another aisle, (v) improve usability and serviceability of the computing devices (e.g., 270, FIG. 2.2), (vi) enhance thermal management of the internal environment of the MITC (e.g., 220, FIG. 2.1), (vii) prevent damage to the hardware components of the computing devices (e.g., 270, FIG. 2.2), and (viii) improve functionality of the hardware components of the computing devices (e.g., 270, FIG. 2.2).

Those skilled in the art will appreciate that while the FT bolts (e.g., 350A, 350D, etc.) are used to secure the bottom RMCs (e.g., 340A), the bottom CDUMCs (e.g., 325A), the IHS (305A), and the CDU (310) to the FTAs (330A, 330B), any other mechanical or non-mechanical components may be used to secure the bottom RMCs (e.g., 340A), the bottom CDUMCs (e.g., 325A), the IHS (305A), and the CDU (310) to the FTAs (330A, 330B) without departing from the scope of the invention.

Those skilled in the art will appreciate that while the first portions of the bottom RMC (340A) and the bottom CDUMC (325A) are shown as having two SHs, the first portions of the bottom RMC (340A) and the bottom CDUMC (325A) may have more SHs or may have only one SH (as long as that SH aligns with at least two MHs) without departing from the scope of the invention.

Those skilled in the art will appreciate that while the bottom RMC (340A) and the bottom CDUMC (325A) are shown as brackets, the bottom RMC (340A) and the bottom CDUMC (325A) may be in another shape (while still providing the same functionalities) without departing from the scope of the invention.

In an embodiment of the invention shown in FIG. 3.1, both bottom RMCs (340A and the second bottom RMC) have the same size to affix the IHS (305A) to the floor (320). As discussed above, without redesigning, the floor (320) has the functionality to host different types of IHSs with the help of the FTAs (330A, 330B). Assuming that the IHS (305A) includes a 750 mm wide rack (e.g., a "first size" rack), the bottom RMCs (e.g., 340A and the second bottom RMC) may then be referred to as "first size" bottom RMCs.

When a second IHS (not shown), which has a rack width greater than the rack width of the IHS (305A), needs to be affixed to the floor (320), "second size" bottom RMCs may need to be used because the second IHS includes a "second size" rack (e.g., a 800 mm wide rack). Similarly, when a third IHS (not shown), which has a rack width less than the rack width of the IHS (305A), needs to be affixed to the floor (320), "third size" bottom RMCs may need to be used because the third IHS includes a "third size" rack (e.g., a 600 mm wide rack).

In an embodiment of the invention shown in FIG. 3.1, both bottom CDUMCs (e.g., 325A and the second bottom CDUMC) have the same size to affix the CDU (310) to the floor (320). As discussed above, without redesigning, the floor (320) has the functionality to host different types of CDUs with the help of the FTAs (330A, 330B). Assuming that the CDU (310) is a "first size" CDU, the bottom CDUMCs (e.g., 325A and the second bottom CDUMC) may then be referred to as "first size" bottom CDUMCs.

When a second CDU (not shown), which has a width greater than the width of the CDU (310), needs to be affixed to the floor (320), "second size" bottom CDUMCs may need to be used because the second CDU is a "second size" CDU. Similarly, when a third CDU (not shown), which has a width less than the width of the CDU (310), needs to be affixed to the floor (320), "third size" bottom CDUMCs may need to be used because the third CDU is a "third size" CDU.

In one or more embodiments, a CDU is a component that controls and provides cooling for IHSs (e.g., 230A, 230B, FIG. 2.1). A CDU may include a pump for a secondary line, a facility valve, one or more temperature sensors, a processing component, and other components to control cooling or other various aspects of the CDU. A CDU may monitor a supply temperature of a secondary line via temperature sensors and may adjust a facility valve position based on the supply temperature of the secondary line.

In one or more embodiments, coolant (e.g., liquid) may flow through a facility line, in which the facility line may travel from a facility (e.g., a system) coolant storage area to a heat exchanger (e.g., a liquid-to-liquid heat exchanger) of a CDU and back to the facility coolant storage area. Coolant may also travel through the secondary line, in which the secondary line travels from the heat exchanger to the IHSs and back to the heat exchanger. The heat exchanger may then transfer heat from the secondary line to the facility line.

In one or more embodiments, based on the supply temperature of the secondary line, the CDU may adjust the facility valve position. The temperature of coolant supplied to the secondary line may indicate a high or a low load on the IHSs and thus on the CDU itself. The CDU may then increase or decrease a flow rate of the coolant based on the facility valve position. In this manner, the CDU may control cooling based in part on an average differential pressure between a supply and a return for the CDU (e.g., for the secondary line), in which the CDU measures the pressure at the supply of the secondary line and at the return of the secondary line.

As used herein, "coolant" may be water, nitrogen, propylene glycol, mineral oil, refrigerant, dielectric, or some combination thereof. A line, such as the secondary line or the facility line, may carry the coolant through the CDU, the facility coolant storage area, the IHSs, or some combination thereof. The line may be a pipe or a duct.

As shown in FIG. 3.1, the IHSs (e.g., 305A, 305B, etc.) and the CDU (310) are lined up in a row, in which the CDU (310) may be referred to as an "in-row" cooling component. In one or more embodiments, with a row-oriented cooling architecture, the CDU (310) is dedicated to cooling one row of IHSs. In order to do that, the CDU (310) may be affixed among the IHSs (e.g., 305A, 305B, etc.), overhead the IHSs (e.g., 305A, 305B, etc.), inside of the IHSs (e.g., 305A, 305B, etc.), or under the floor (320). Comparing to "room-based" cooling (where cold air is pushed into an entire room rather than directly onto a hot component), in-row cooling provides clearly defined airflow paths toward increasing cooling efficiency of the MECC (e.g., 210, FIG. 2.1).

In one or more embodiments, a row-oriented cooling architecture allows cooling capacity and redundancy to be targeted to the actual needs of specific rows. For example, the CDU (310) allows one row of IHSs (e.g., blade servers) to perform high density applications, while another row of IHSs (e.g., communication enclosures) performs low power density applications. As yet another example, mission critical IHSs may reside in a row that features redundant cooling, and less critical IHSs may reside in a row without redundant cooling. Further, a row-oriented cooling architecture may be implemented without having a raised floor, which (i) increases a floor load bearing capacity, (ii) reduces installation costs, (iii) eliminates a need for access ramps, and (iv) allows data centers to exists in building that otherwise do not have headroom to permit the installation of a raised floor.

The aforementioned examples are not intended to limit the scope of the invention.

As used herein, a "row" means a number of components arranged in a line. A row may include components arranged in a straight line or may include components arranged in a curved line. For example, a row of IHSs may include multiple IHSs arranged in a line.

Those skilled in the art will appreciate that while the details of the bottom RMC (340A), the bottom CDUMC (325A), the IHS (305A), the CDU (310), and the FTAs (330A, 330B) are discussed above, those details also apply to other RMCs, CDUMCs, IHSs, CDUs, and FTAs disposed within the MITC (e.g., 220, FIG. 2.1) without departing from the scope of the invention.

Turning now to FIG. 3.2, FIG. 3.2 shows a side view of a portion of the system of FIG. 1 in accordance with one or more embodiments of the invention. In an embodiment of the invention shown in FIG. 3.2, the embodiment includes the CDU (310), a floor of the MITC (352), a first set of isolators (356A-356C), the floor (320), the FT bolts (e.g., 350E, 350F, etc.), the FTAs (330A, 330B), a first inner component (327B), a second inner component (327A), and the bottom CDUMCs (325A, 325B). Each component illustrated in FIG. 3.2 is described below.

As shown in FIG. 3.2, the floor (320) includes three portions, in which (i) the CDU (310) is located on the second portion of the floor (320), (ii) the FTA (330A) is located on the first portion of the floor (320), and (iii) the FTA (330B) is located on the third portion of the floor (320). In one or more embodiments, the floor (320) has a shape that is elevated in the middle (e.g., the second portion) and depressed on the sides. Said another way, the second portion is elevated (e.g., has a different height) relative to the depressions (e.g., first portion and the third portion). In those depressions (e.g., gaps), the FTAs (330A, 330B) are integrated such that the FTAs (330A, 330B) fill out the depressions.

Those skilled in the art will appreciate that while the floor (320) is shown as having a particular shape, the floor (320) may be in another shape (while still providing the same functionalities) without departing from the scope of the invention.

As discussed above in reference to FIG. 3.1, each bottom CDUMC includes two portions (e.g., the first portion and the second portion). As shown in FIG. 3.2, the first portion of the bottom CDUMC (325B) allows the first set of FT bolts (e.g., 350E) to pass through and interface with (shown with dashed lines) the first set of MHs (e.g., 335E). When the SHs of the bottom CDUMC (325B) are aligned with the first set of MHs (e.g., 335E), the first set of FT bolts (e.g., 350E) is used to secure the bottom CDUMC (325B) to the FTA (330A). In this manner, a rear side of the CDU (310) is affixed to the floor (320).

Further, the second portion of the CDUMC (325B) includes a hook (360A) where the hook (360A) is configured to attach to (e.g., grab) the second inner component (327A) located inside of the CDU (310). In this manner, the CDUMC (325B) is attached to the CDU (310) in order to secure the rear side of the CDU (310) to the floor (320). In one or more embodiments, the hook (360A) is a piece of metal (or any other material) that is curved or bent back at an angle to attach to protrusions (e.g., inner components) of non-compatible components.

Similarly, the first portion of the bottom CDUMC (325A) allows the second set of FT bolts (e.g., 350F) to pass through and interface with (shown with dashed lines) the second set of MHs (e.g., 335F). When the SHs of the bottom CDUMC (325A) are aligned with the second set of MHs (e.g., 335F), the second set of FT bolts (e.g., 350F) is used to secure the bottom CDUMC (325A) to the FTA (330B). In this manner, a front side of the CDU (310) is affixed to the floor (320).

Further, the second portion of the CDUMC (325A) includes a hook (360B) where the hook (360B) is configured to attach to the first inner component (327B) located inside of the CDU (310). In this manner, the CDUMC (325A) is attached to the CDU (310) in order to secure the front side of the CDU (310) to the floor (320).

Those skilled in the art will appreciate that while the hooks (360A, 360B) and the inner components (327A, 327B) are shown as having a particular shape, the hooks (360A, 360B) and the inner components (327A, 327B) may be in another shape (while still providing the same functionalities) without departing from the scope of the invention.

In one or more embodiments, the floor (320) is affixed to the first set of isolators (356A-356C). Similar to the floor (320), each isolator includes six sides, in which the top side of each isolator is affixed to the bottom side of the floor (320). Further, the bottom side of each isolator is affixed to the floor of the MITC (352), in which the floor of the MITC (352) may be to the bottom side of the MITC (e.g., 220, FIG. 2.1).

In one or more embodiments, the first set of isolators (356A-356C) makes sure that the CDU (310) (and the components disposed within) are ready-to-use when the system (e.g., 100, FIG. 1) is deployed to the customer site. In one or more embodiments, the first set of isolators (356A-356C) provides a shock isolation to the CDU (310) such that the components disposed within the CDU (310) may be protected from any damage. With this way, the CDU (310) may be shipped to the customer site without requiring any shock pallets.

In one or more embodiments, the top side of each isolator may be affixed to the bottom side of the floor (320) using mechanical or non-mechanical mechanisms without departing from the scope of the invention. Similarly, the bottom side of each isolator may be affixed to the floor of the MITC (352) using mechanical or non-mechanical mechanisms without departing from the scope of the invention. Further, because the floor (320) is located on top of the first set of isolators (356A-356C), the floor (320) may be referred to as a "raised floor".

A "raised floor" is a data center construction model where a slightly higher floor is constructed above a floor (e.g., a bottom side) of the data center. A raised floor allows to generate an open space between the two floors for a better (i) cold air distribution (via, for example, bottom ducting components), (ii) air containment, and (iii) cable management within the data center.

Turning now to FIG. 3.3, FIG. 3.3 shows a side view of a portion of the system of FIG. 1 in accordance with one or more embodiments of the invention. In an embodiment of the invention shown in FIG. 3.3, the embodiment includes a rack (312), the floor of the MITC (352), a set of bolts (e.g., 354A, 354B, etc.), a second set of isolators (356D-356F), the floor (320), the FT bolts (e.g., 350G, 350H, etc.), the FTAs (330A, 330B), and the bottom RMCs (340A, 340B). In one or more embodiments, the rack (312) may be the rack of the IHS (305A) as discussed above in reference to FIG. 3.1, in which the rack (312) is located on the second portion of the floor (320).

As discussed above in reference to FIG. 3.1, each bottom RMC includes two portions. As shown in FIG. 3.3, the first portion of the bottom RMC (340B) allows the first set of FT bolts (e.g., 350G) to pass through and interface with (shown with dashed lines) the first set of MHs (e.g., 335G). When the SHs of the bottom RMC (340B) are aligned with the first set of MHs (e.g., 335G), the first set of FT bolts (e.g., 350G) is used to secure the bottom RMC (340B) to the FTA (330A). In this manner, a rear side of the rack (312) is affixed to the floor (320).

Further, the second portion of the bottom RMC (340B) includes a first set of holes (not shown) to be aligned with the second set of MHs (e.g., 266A, 266B, FIG. 2.2) located on the rack (312). The first set of holes allows a first set of bolts (e.g., 354A) to pass through and interface with (shown with the dashed lines) the second set of MHs (e.g., 266A, 266B, FIG. 2.2) located on the rack (312). When the first set of holes is aligned with the second set of MHs (e.g., 266A, 266B, FIG. 2.2) located on the rack (312), the first set of bolts (e.g., 354A) is used to secure the rack (312) to the bottom RMC (340B) itself.

Similarly, the first portion of the bottom RMC (340A) allows the second set of FT bolts (e.g., 350H) to pass through and interface with (shown with the dashed lines) the second set of MHs (e.g., 335H). When the SHs of the bottom RMC (340A) are aligned with the second set of MHs (e.g., 335H), the second set of FT bolts (e.g., 350H) is used to secure the bottom RMC (340A) to the FTA (330B). In this manner, a front side of the rack (312) is affixed to the floor (320).

Further, the second portion of the bottom RMC (340A) includes a second set of holes (not shown) to be aligned with the second set of MHs (e.g., 266A, 266B, FIG. 2.2) located on the rack (312). The second set of holes allows a second set of bolts (e.g., 354B) to pass through and interface with (shown with the dashed lines) the second set of MHs (e.g., 266A, 266B, FIG. 2.2) located on the rack (312). When the second set of holes is aligned with the second set of MHs (e.g., 266A, 266B, FIG. 2.2) located on the rack (312), the second set of bolts (e.g., 354B) is used to secure the rack (312) to the bottom RMC (340A) itself.

Those skilled in the art will appreciate that while the set of bolts (e.g., 354A, 354B, etc.) is used to secure the bottom RMCs (340A, 340B) to the rack (312), any other mechanical or non-mechanical components may be used to secure the bottom RMCs (340A, 340B) to the rack (312) without departing from the scope of the invention.

In one or more embodiments, the floor (320) is also affixed to the second set of isolators (356D-356F), in which the top side of each isolator is affixed to the bottom side of the floor (320). Further, the bottom side of each isolator is affixed to the floor of the MITC (352).

In one or more embodiments, the second set of isolators (356D-356F) makes sure that the rack (312) (and the computing devices disposed within) are ready-to-use when the system (e.g., 100, FIG. 1) is deployed to the customer site. In one or more embodiments, the second set of isolators (356D-356F) provides a shock isolation to the rack (312) such that the computing devices disposed within the rack (312) may be protected from any damage.

In one or more embodiments, the top side of each isolator may be affixed to the bottom side of the floor (320) using mechanical or non-mechanical mechanisms without departing from the scope of the invention. Similarly, the bottom side of each isolator may be affixed to the floor of the MITC (352) using mechanical or non-mechanical mechanisms without departing from the scope of the invention. Further, because the floor (320) is located on top of the second set of isolators (356D-356F), the floor (320) may be referred to as a "raised floor".

Figure 4:
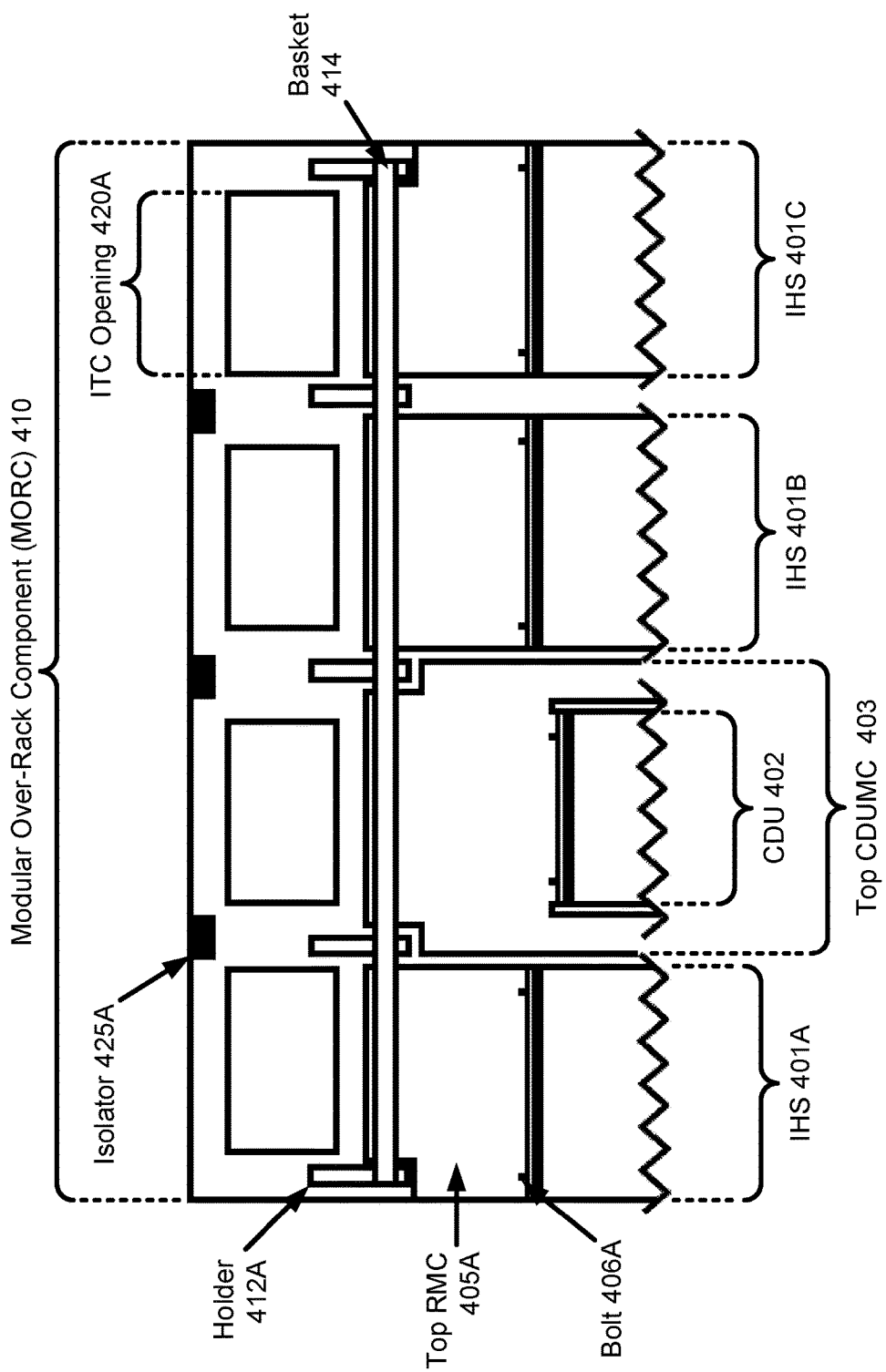
FIG. 4 shows a front view of a portion of a modular information technology component (MITC) in accordance with one or more embodiments of the invention.

Turning now to FIG. 4, FIG. 4 shows a front view of a portion of a modular information technology component (MITC) (e.g., 220, FIG. 2.1) in accordance with one or more embodiments of the invention. In an embodiment of the invention shown in FIG. 4, the embodiment includes a MORC (410), a tray (not shown), a set of ITC openings (e.g., 420A), a set of isolators (e.g., 425A), top RMCs (e.g., 405A), a top CDUMC (403), one or more bolts (e.g., 406A), a set of IHSs (401A-401C), and a CDU (402). The IHS (e.g., 401B) may be the same as the IHS (305A) as discussed above in reference to FIG. 3.1. Similarly, the CDU (402) may be the same as the CDU (310) as discussed above in reference to FIG. 3.1.

In one or more embodiments, a group of IHSs and a group of CDUs are deployed to the white space within the MITC (e.g., 220, FIG. 2.1). The group of IHSs includes, for example, four IHSs (e.g., IHS (401A)) and the group of CDUs includes, for example, four CDUs (e.g., CDU (402)). In one or more embodiments, for example, the IHS (401A) includes a 750 mm wide rack and the CDU (402) includes a 600 mm enclosure.

The aforementioned examples are not intended to limit the scope of the invention.

In one or more embodiments, the IHSs are lined up in a row, for example, to generate the group of IHSs. Similarly, the CDUs are lined up in a row (next to the first group of IHSs), for example, to generate the group of CDUs.

The aforementioned examples are not intended to limit the scope of the invention.

In one or more embodiments, instead of grouping the CDUs, one or more CDUs may be added to the group of IHSs. For example, instead of adding a CDU into the group of CDUs, that particular CDU may be added into the group of IHSs. To accommodate this alteration in the group of IHSs, another type of air containment component (e.g., a top CDUMC) (discussed below) may be affixed to the MORC (410). In this manner, the MORC (410) may provide mechanical support to the IHSs (401A-401C) and to the CDU (402).

The aforementioned example is not intended to limit the scope of the invention.

In one or more embodiments, based on the arrangement of (or grouping of) the IHSs, a first type of MORC (e.g., the MORC (410)) may be affixed above the group of IHSs. Similarly, a second type of MORC (not shown) may be affixed above the group of CDUs. Comparing to the first type of MORC (410), the second type of MORC may have different structural characteristics, for example (but not limited to): a different number of ITC openings, a different number of isolators, etc.

The aforementioned example is not intended to limit the scope of the invention.

For example, the first type of MORC (410) may include four ITC openings (e.g., 420A) to be aligned with the group of IHSs below the first type of MORC (410). As yet another example, the second type of MORC may include four ITC openings (e.g., 420A) to be aligned with the group of CDUs below the second type of MORC.

The aforementioned examples are not intended to limit the scope of the invention.

In one or more embodiments, the ITC openings (e.g., 420A) may have a functionality to host one or more information technology components (ITCs). For example, based on a customer requirement, an ITC may need be mounted to the ITC opening (e.g., 420A). An ITC may be, for example (but not limited to): a network switch, a network router, a battery, a UPS, etc. In one or more embodiments, the ITC openings (e.g., 420A) may also have a functionality to provide structural support to the ITCs in case of a seismic event. For this reason, the ITC openings (e.g., 420A) may include at least one or more mechanical hard-stops.

Those skilled in the art will appreciate that while the ITC openings (e.g., 420A) are shown as rectangular openings, the ITC openings (e.g., 420A) may be in another shape (while still providing the same functionalities) without departing from the scope of the invention.

Those skilled in the art will appreciate that while the ITC openings (e.g., 420A) are shown as having the same size (e.g., a 4 RU width) along the length of the MORC (410), the ITC openings (e.g., 420A) may have different sizes along the length of the MORC (410) without departing from the scope of the invention.

In one or more embodiments, when one or more IHSs and CDUs are lined up in a row (discussed above), air from a cold air source (e.g., a cold aisle) may flow between, above, and/or below the IHSs and the CDUs, and may mix with air from a hot air source (e.g., a hot aisle). Air leaks of cold air or hot air between, above, and/or below the IHSs and the CDUs may reduce an efficiency of the MECC (e.g., 210, FIG. 2.1), and may cause the computing devices of the IHSs to receive inadequate cooling.

In some cases, hot air may mix with cold air in a cold aisle prior to the cold air being drawn into the computing devices, thus the hot air may pre-heat the cold air. In order to reduce air leaks and mixing of cold air with heated air (prior to the cold air being drawn into the computing devices), air containment components may be used.

In one or more embodiments, "air containment" refers to physical barriers used in a hot aisle and/or in a cold aisle to minimize the mixing of cold (e.g., supply) air and hot (e.g., exhaust) air. The physical barriers prevent hot "exhaust" air from flowing over the tops of the IHSs, mixing with the cold "supply" air, and thereby increase cooling capacity of the cold air. With the air containment components in place, for example, the MECC (e.g., 210, FIG. 2.1) may reduce its fan speeds and may use higher temperature chilled water. Otherwise, the MECC (e.g., 210, FIG. 2.1) may need to operate longer to make up for higher temperatures in the cold aisle and to enhance thermal management of the internal environment of the MITC (e.g., 220, FIG. 2.1).

In one or more embodiments, the top RMCs (e.g., 405A) and the top CDUMC (403) may provide one or more functionalities to the IHSs (401A-401C) and to the CDU (402), respectively. For example, the top RMCs (e.g., 405A) may act as mechanical hard-stop components and may provide structural support to the IHSs (401A-401C) in case of a seismic event. As yet another example, the top RMCs (e.g., 405A) may also provide structural support to the IHSs (401A-401C) to keep the IHSs (401A-401C) connected to the MORC (410). As yet another example, the top CDUMC (403) may act as a mechanical hard-stop component and may provide structural support to the CDU (402) in case of a seismic event. Further, the top CDUMC (403) may also provide structural support to the CDU (402) to keep the CDU (402) connected to the MORC (410).

In one or more embodiments, in addition to being mechanical hard-stop components, the top RMCs (e.g., 405A) and the top CDUMC (403) may act as air containment components, in which the top RMCs (e.g., 405A) and the top CDUMC (403) may segregate cold air in a cold aisle from hot air in a hot aisle (or from other air in the MITC (e.g., 210, FIG. 2.1)). In this manner, top RMCs (e.g., 405A) and the top CDUMC (403) may provide one or more features to support the air containment within the MITC (e.g., 220, FIG. 2.1). Details of the features are described below in reference to FIG. 3.1.

In one or more embodiments, in order to secure, for example, the IHS (401A) to the MORC (410), the top RMC (405A) may be a bracket (e.g., an L bracket) that includes two portions. For example, a first portion of the top RMC (405A) refers to a portion of the top RMC (405A) that is secured to the first set of MHs (e.g., 265B, 265D, FIG. 2.2) to affix the top RMC (405A) to the top side of the IHS (401A). A second portion of the top RMC (405A) refers to a portion of the top RMC (405A) that is secured to a set of MHs (not shown) located on the front side of the MORC (410) to affix the top RMC (405A) to the front side of the MORC (410).

In one or more embodiments, the first portion of the top RMC (405A) includes a first set of holes (not shown) that allows the bolts (e.g., 406A) to pass through and interface with the first set of MHs (e.g., 265B, 265D, FIG. 2.2). When the first set of holes is aligned with the first set of MHs (e.g., 265B, 265D, FIG. 2.2), the bolts (e.g., 406A) are used to secure the top RMC (405A) to the top side of the IHS (401A).

Further, the second portion of the top RMC (405A) includes a second set of holes (not shown) to be aligned with the set of MHs. The second set of holes allows a set of bolts (not shown) to pass through and interface with the set of MHs. When the second set of holes is aligned with the set of MHs, the set of bolts is used to secure the top RMC (405A) to the front side of the MORC (410). In this manner, the IHS (401A) is secured to the MORC (410).

Those skilled in the art will appreciate that while the bolts (e.g., 406A) are used to secure the top RMC (405A) to the top side of the IHS (401A) and to the front side of the MORC (410), any other mechanical or non-mechanical components may be used to secure the secure the top RMC (405A) to the top side of the IHS (401A) and to the front side of the MORC (410) without departing from the scope of the invention.

Those skilled in the art will appreciate that while the top RMC (405A) is shown as a bracket, the top RMC (405A) may be in another shape (while still providing the same functionalities) without departing from the scope of the invention.

Those skilled in the art will appreciate that while the top RMC (405A) is shown as a single (e.g., a monolithic) component, the top RMC (405A) may be manufactured as having at least two components (while still providing the same functionalities) without departing from the scope of the invention.

In one or more embodiments, in order to secure, for example, the CDU (402) to the MORC (410), the top CDUMC (403) may be a bracket (e.g., an L bracket with tails) that includes two portions. For example, a first portion of the top CDUMC (403) refers to a portion of the top CDUMC (403) that is secured to a set of MHs (not shown) located on the top side of the CDU (402) to affix the top CDUMC (403) to the top side of the CDU (402). A second portion of the top CDUMC (403) refers to a portion of the top CDUMC (403) that is secured to a second set of MHs (not shown) located on the front side of the MORC (410) to affix the top CDUMC (403) to the front side of the MORC (410).

In one or more embodiments, the first portion of the top CDUMC (403) includes a first set of holes (not shown) that allows bolts to pass through and interface with the first set of MHs. When the first set of holes is aligned with the first set of MHs, bolts are used to secure the top CDUMC (403) to the top side of the CDU (402).

Further, the second portion of the top CDUMC (403) includes a second set of holes (not shown) to be aligned with the second set of MHs. The second set of holes allows a set of bolts (not shown) to pass through and interface with the second set of MHs. When the second set of holes is aligned with the second set of MHs, the set of bolts is used to secure the top CDUMC (403) to the front side of the MORC (410). In this manner, the CDU (402) is secured to the MORC (410).

Those skilled in the art will appreciate that while the bolts are used to secure the top CDUMC (403) to the top side of the CDU (402) and to the front side of the MORC (410), any other mechanical or non-mechanical components may be used to secure the secure the top CDUMC (403) to the top side of the CDU (402) and to the front side of the MORC (410) without departing from the scope of the invention.

Those skilled in the art will appreciate that while the top CDUMC (403) is shown as a bracket, the top CDUMC (403) may be in another shape (while still providing the same functionalities) without departing from the scope of the invention.

Those skilled in the art will appreciate that while the top CDUMC (403) is shown as a single (e.g., a monolithic) component, the top CDUMC (403) may be manufactured as having at least two components (while still providing the same functionalities) without departing from the scope of the invention.

In one or more embodiments, comparing to the IHS (401A), the CDU (402) has a different size and shape. For this reason, a different type of air containment component (e.g., top CDUMC (403)) is used (i) to affix the top side of the CDU (402) to the MORC (410), (ii) to fill out any gaps that exist between the CDU (402) and the MORC (410), and (iii) to fill out any gaps that exist between the IHSs (e.g., 401A, 401B, etc.) and the CDU (402).

In one or more embodiments, as an additional airflow management strategy to minimize air leakage, the first type of MORC (410) and the second type of MORC may include air restrictors for cable feeds where they enter into the MORCs (e.g., 410). In one or more embodiments, an air restrictor may be, for example (but not limited to): a brush cable pass-thru component, a brush grommet, etc. Further, to close any gaps that exist between two top air containment components: (i) another top RMC (in any shape or size) may be affixed between the top RMCs, (ii) another top CDUMC (in any shape or size) may be affixed between the top CDUMCs, and (iii) another top RMC (in any shape or size) may be affixed between to the top RMC and the top CDUMC. In this manner, air leakage may also be minimized.

To further improve the cooling efficiency of the MECC (e.g., 210, FIG. 2.1), for example, the second portion of the top RMC (405A) may include a gasket (e.g., a continuity gasket) to seal air from leaking past the top RMC (430A). Similarly, the second portion of the top CDUMC (403) may also include a gasket to seal air from leaking past the top CDUMC (403). In one or more embodiments, the gasket may be, for example (but not limited to): a foam gasket, a rubber gasket, etc.

In addition, the ITC openings (e.g., 420A) may include a shutter (not shown) to support the air containment within the internal environment of the MITC (e.g., 220, FIG. 2.1). For example, when an ITC needs to be placed (e.g., mounted) within the ITC opening (e.g., 420A), the shutter of the ITC opening (e.g., 420A) needs to be opened. The ITC may be then be mounted within the ITC opening (e.g., 420A). As yet another example, if the ITC opening is not in use, the shutter of the ITC opening (e.g., 420A) may be closed. In this manner, the shutter may act as an air containment component to minimize mixing of hot air and cold air.

The aforementioned examples are not intended to limit the scope of the invention.

Those skilled in the art will appreciate that while the details of the top RMC (405A), the top CDUMC (403), the IHS (401A), the CDU (402), and the MORC (410) are discussed above, those details also apply to other top RMCs, top CDUMCs, IHSs, CDUs, and MORCs disposed within the MITC (e.g., 220, FIG. 2.1) without departing from the scope of the invention.

In one or more embodiments, the MORC (410) includes the set of isolators (e.g., 425A) to make sure that the MORC (410) (and the ITCs mounted within) are ready-to-use when the system (e.g., 100, FIG. 1) is deployed to the customer site. In one or more embodiments, the set of isolators (e.g., 425A) provides a shock isolation to the MORC (410) such that the ITCs may be protected from any damage.

In one or more embodiments, the MORC (410) may be affixed to the ceiling of the MITC (e.g., 220, FIG. 2.1) via a metal framing component (e.g., a strut channel, a unistrut channel, etc.) in between, in which the top side of metal framing component is affixed (e.g., welded) to the ceiling of the MITC (e.g., 220, FIG. 2.1). In one or more embodiments, each isolator also includes six sides, in which the top side of each isolator may be affixed to the bottom side of the metal framing component using mechanical or non-mechanical mechanisms. In this manner, one isolator may be connected to another isolator and the set of isolators (e.g., 425A) may operate in conjunction.

In one or more embodiments, the MORC (410) includes a tray that is made of a basket (414) and a set of holders (e.g., 412A).

As being mechanical support components, both the set of holders (e.g., 412A) and the basket (414) are configured to carry cables (e.g., power cables, network cables, etc.) that are routed from one component (e.g., a network switch, a busway plug, etc.) to another component (e.g., a network router, a computing device, etc.) for power distribution, control, and communication. Further, the set of holders (e.g., 412A) and the basket (414) are configured to prevent cable congestion at the front sides of the IHSs (401A-401C) and the CDU (402) for a better cable management.

For example, a network cable may be routed directly from the tray to a line card (e.g., a modular electronic circuit interfacing with a network) included in the IHS (401A). In this manner, the tray (401A) may help the network communication between the network switch and the computing devices disposed within the IHS (401A). As yet another example, a power cable (e.g., a busway whip) may be routed directly from the tray to a power distribution unit (PDU) disposed within the IHS (401A). In this manner, the tray may help distribution of power to components disposed within the IHS (401A).

The aforementioned examples are not intended to limit the scope of the invention.

As used herein, a "cable" includes any cable, conduit, or line that carries one or more conductors and that is flexible over at least a portion of its length. A cable may include a connector portion, such as a plug, at one or more of its ends.

In one or more embodiments, the MORC (410) may include a second tray that is made of a second basket (not shown) and a second set of holders (not shown). As being mechanical support components, both the second set of holders and the second basket may be configured to carry cables that are routed from one component to another component for power distribution, control, and communication. Further, the second set of holders and the second basket may also be configured to prevent cable congestion at the rear sides of the IHSs (401A-401C) and the CDU (402) for a better cable management.

In one or more embodiments, the holders (e.g., 412A) and the baskets (e.g., 414) may be made of, for example (but not limited to): galvanized steel, stainless steel, aluminum, glass-fiber reinforced plastic, etc.

Those skilled in the art will appreciate that while the baskets (e.g., 414) and the holders (e.g., 412A) are shown as having a particular size, shape, and placement, the baskets (e.g., 414) and the holders (e.g., 412A) may have any size, shape, and placement (while still providing the same functionalities) without departing from the scope of the invention.

In one or more embodiments, based on the above-described mounting apparatuses (e.g., top and bottom CDUMCs and RMCs), a customer may have a flexibility to easily affix non-compatible and compatible components to the floor (i) without requiring the resource-intensive efforts and (ii) without worrying about effects of various alterations occurred in the white space.

The problems discussed throughout this application should be understood as being examples of problems solved by embodiments described herein, and the various embodiments should not be limited to solving the same/similar problems. The disclosed embodiments are broadly applicable to address a range of problems beyond those discussed herein.

While embodiments discussed herein have been described with respect to a limited number of embodiments, those skilled in the art, having the benefit of this Detailed Description, will appreciate that other embodiments can be devised which do not depart from the scope of embodiments as disclosed herein. Accordingly, the scope of embodiments described herein should be limited only by the attached claims.

What is claimed is:

1. A modular information technology component (MITC), comprising:
   a component;
   a floor, wherein the floor comprises a first section, a second section, a third section, a floor track apparatus (FTA), and a second FTA,
   wherein the FTA is located on a first side of the floor and extends along the first side,
   wherein the second FTA is located on a second side of the floor and extends along the second side,
   wherein the first side and the second side are parallel to each other
   wherein the FTA and the second FTA are rails,
   wherein the second section is elevated relative to the first section and the third section,
   wherein an information handling system (IHS) and a cooling distribution unit are located on the second section, wherein the FTA is integrated into the first section and the second FTA is integrated into the third section; and
   a bottom mounting component (BMC),
   wherein the BMC affixes the component to the FTA.

2. The MITC of claim 1, wherein the component is a second cooling distribution unit, wherein the BMC is a bottom cooling distribution unit mounting component.

3. The MITC of claim 1, wherein the FTA comprises a first set of mounting holes (MHs), wherein the first set of MHs is aligned along the first side of the floor, and wherein the second FTA comprises a second set of MHs, wherein the second set of MHs is aligned along the second side of the floor.

4. The MITC of claim 3,
   wherein the component comprises an inner component,
   wherein the BMC comprises a first portion and a second portion,
   wherein the first portion of the BMC is a bracket, wherein the bracket is affixed to the first set of MHs, and
   wherein the second portion of the BMC comprises a hook, wherein the hook is configured to attach to the inner component.

5. The MITC of claim 4,
   wherein the component further comprises a second inner component, wherein the MITC further comprises a second BMC,
   wherein the second BMC comprises a first portion and a second portion,
   wherein the first portion of the second BMC is a second bracket, wherein the second bracket is affixed to the second set of MHs, and
   wherein the second portion of the second BMC is a second hook, wherein the second hook is attached to the second inner component.

6. The MITC of claim 1, further comprising: a second IHS and a rack mounting component (RMC), wherein the RMC affixes the second IHS to the FTA.

7. The MITC of claim 6, wherein the floor is affixed to a set of isolators, wherein the set of isolators provides a shock isolation to the second IHS and to the component.

8. The MITC of claim 6, wherein the FTA further comprises a first set of MHs, wherein the first set of MHs is aligned along the first side of the floor, and wherein the second FTA comprises a second set of MHs, wherein the second set of MHs is aligned along the second side of the floor.

9. The MITC of claim 8, wherein the RMC is a bracket, wherein the bracket comprises a first portion and a second portion, wherein the first portion of the bracket is affixed to the second IHS, and wherein the second portion of the bracket is affixed to the first set of MHs.

10. The MITC of claim 9, further comprising: a second RMC, wherein the second RMC is a second bracket, wherein the second bracket comprises a first portion and a second portion, wherein the first portion of the second bracket is affixed to the second IHS, and wherein the second portion of the second bracket is affixed to the second set of MHs.

11. A modular information technology component (MITC), comprising: a modular over-rack component (MORC);
    a top rack mounting component (RMC), wherein the top RMC affixes an information handling system (IHS) to the MORC, and wherein the top RMC provides air containment within an internal environment of the MITC;
    an information technology component (ITC),
    wherein the MORC comprises a set of ITC openings,
    wherein the set of ITC openings enables mounting of the ITC into the MORC; and
    a top cooling distribution unit mounting component (CDUMC),
    wherein the top CDUMC affixes a cooling distribution unit (CDU) to the MORC, and
    wherein the top CDUMC provides second air containment within the internal environment of the MITC.

12. The MITC of claim 11, wherein the ITC is a network switch.

13. The MITC of claim 11,
    further comprising a tray,
    wherein the tray is affixed to the MORC,
    wherein the tray carries cables of the ITC, and
    wherein the cables transmit or receive power and data from a second ITC.

14. The MITC of claim 11, wherein the MORC comprises a set of isolators, wherein the set of isolators provides a shock isolation to the MORC.

15. The MITC of claim 11, further comprising: a plurality of information handling systems (IHSs), wherein each IHS comprises a rack and a plurality of computing devices, wherein the rack is a housing for the plurality of computing devices, wherein the CDU provides coolant to the plurality of IHSs to cool off the plurality of computing devices.

16. A modular data center, comprising:
a modular information technology component (MITC),
wherein the MITC comprises a cooling distribution unit (CDU), a floor, a bottom cooling distribution unit mounting component (CDUMC), a modular over-rack component (MORC), and a top CDUMC,
wherein the floor comprises a floor track apparatus (FTA),
wherein the bottom CDUMC affixes the CDU to the FTA,
wherein the top CDUMC affixes the CDU to the MORC,
wherein the top CDUMC provides air containment with an internal environment of the MITC; and
a modular environmental control component (MECC),
wherein the MECC comprises a plurality of environmental control components (ECCs) and built-in airflow connection components, wherein the built-in airflow connection components remove and supply air to the MITC.

17. The modular data center of claim 16, further comprising:
a top rack mounting component (RMC), wherein the top RMC affixes an information handling system (IHS) to the MORC, and wherein the top RMC provides second air containment within the internal environment of the MITC.

* * * * *